US012489090B2

(12) United States Patent
Shibata

(10) Patent No.: US 12,489,090 B2
(45) Date of Patent: Dec. 2, 2025

(54) SEMICONDUCTOR APPARATUS

(71) Applicant: ROHM CO., LTD., Kyoto (JP)

(72) Inventor: Kotaro Shibata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 333 days.

(21) Appl. No.: 18/256,160

(22) PCT Filed: Jan. 7, 2022

(86) PCT No.: PCT/JP2022/000420

§ 371 (c)(1),
(2) Date: Jun. 6, 2023

(87) PCT Pub. No.: WO2022/158322

PCT Pub. Date: Jul. 28, 2022

(65) Prior Publication Data

US 2024/0038734 A1 Feb. 1, 2024

(30) Foreign Application Priority Data

Jan. 19, 2021 (JP) ................................ 2021-006269

(51) Int. Cl.
*H01L 25/07* (2006.01)
*H01L 23/00* (2006.01)
*H01L 23/538* (2006.01)

(52) U.S. Cl.
CPC ........ *H01L 25/072* (2013.01); *H01L 23/5386* (2013.01); *H01L 24/48* (2013.01); *H01L 2224/48225* (2013.01)

(58) Field of Classification Search
CPC ... H01L 25/072; H01L 23/5386; H01L 24/48; H01L 24/49
See application file for complete search history.

(56) References Cited

U.S. PATENT DOCUMENTS

2021/0287978 A1* 9/2021 Yamada ............ H01L 23/49844

FOREIGN PATENT DOCUMENTS

JP 2016-225493 12/2016

OTHER PUBLICATIONS

International Search Report issued in International Application No. PCT/JP2022/000420, Apr. 5, 2022, 2 pages.

* cited by examiner

*Primary Examiner* — Walter H Swanson
(74) *Attorney, Agent, or Firm* — HSML P.C.

(57) ABSTRACT

A semiconductor device includes semiconductor elements. Each semiconductor element, including first, second and third electrodes, is controlled to turn on and off current flow between the first electrode and the second electrode by drive signals inputted to the third electrode. The first electrodes of the semiconductor elements are electrically connected mutually, and the second electrodes of the semiconductor elements are electrically connected mutually. The semiconductor device further includes a control terminal receiving the drive signals, a first wiring section connected to the control terminal, a second wiring section, and third wiring sections, and further a first connecting member electrically connecting the first and the second wiring sections, a second connecting member electrically connecting the second wiring section and each third wiring section, and third connecting members connecting the third wiring sections and the third electrodes of the semiconductor elements.

20 Claims, 22 Drawing Sheets

A1

SEMICONDUCTOR APPARATUS

TECHNICAL FIELD

The present disclosure relates to semiconductor devices.

BACKGROUND ART

Conventionally, semiconductor devices provided with power semiconductor elements, such as metal-oxide-semiconductor field-effect transistors (MOSFETs) and insulated gate bipolar transistors (IGBTs), have been known. It is also known that the current carrying capacity of such a semiconductor device is ensured by connecting the plurality of power semiconductor elements in parallel (e.g., Patent Document 1). A power module described in Patent Document 1 includes a plurality of first semiconductor elements, a plurality of first connecting lines, a wiring layer and a signal terminal. The first semiconductor elements are composed of MOSFETs, for example. Each first semiconductor element turns on and off according to a drive signal inputted to its gate terminal. The first connecting lines, which may be wires, connect the gate terminals of the first semiconductor elements to the wiring layer. The wiring layer is connected to the signal terminal. The signal terminal is thus connected to the gate terminals of the first semiconductor elements via the wiring layer and the first connecting lines. The signal terminal provides a drive signal for driving each first semiconductor element to the gate terminals of the first semiconductor elements.

PRIOR ART DOCUMENT

Patent Document

Patent Document 1: JP-A-2016-225493

SUMMARY OF INVENTION

Problem to be Solved by the Invention

A power semiconductor element that switches at high speed may cause unexpected oscillation to a drive signal (e.g., gate voltage). Oscillation of a drive signal in a power semiconductor element may cause malfunction of a circuit (e.g., a semiconductor device) containing the power semiconductor element.

In view of the circumstances described above, the present disclosure may aim, for example, to provide a semiconductor device configured to prevent or reduce oscillation of a drive signal.

Means to Solve the Problem

A semiconductor device according to the present disclosure includes: a plurality of first semiconductor elements each including a first electrode, a second electrode and a third electrode and each controlled to turn on and off current flow between the first electrode and the second electrode according to a first drive signal inputted to the third electrode; a first control terminal that receives the first drive signal; a first wiring section to which the first control terminal is electrically connected; a second wiring section spaced apart from the first wiring section; a plurality of third wiring sections spaced apart from the first wiring section and the second wiring section; a first connecting member electrically connecting the first wiring section and the second wiring section; a second connecting member electrically connecting the second wiring section and each of the plurality of third wiring sections; and a plurality of third connecting members each connecting one of the plurality of third wiring sections and the third electrode of one of the plurality of first semiconductor elements. The first electrodes of the plurality of first semiconductor elements are electrically connected to each other. Also, the second electrodes of the plurality of first semiconductor elements are electrically connected to each other.

Advantages of Invention

The semiconductor device configured as described above can prevent oscillation of a drive signal.

MODE FOR CARRYING OUT THE INVENTION

Figure 1:
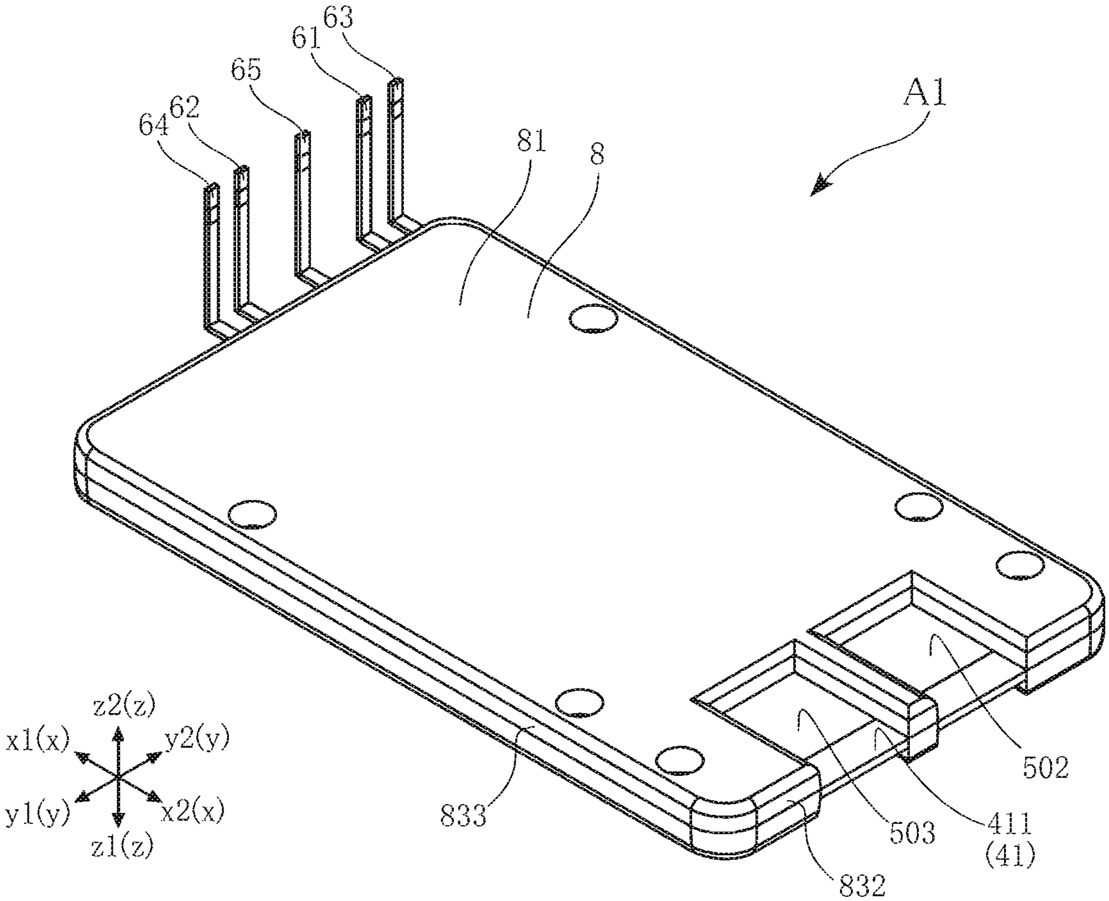
FIG. 1 is a perspective view of a semiconductor device according to a first embodiment.

The following describes preferred embodiments of a semiconductor device according to the present disclosure with reference to the drawings. In the following description, the same or similar elements are denoted by the same reference numerals and a description of such an element will not be repeated.

Figure 2:
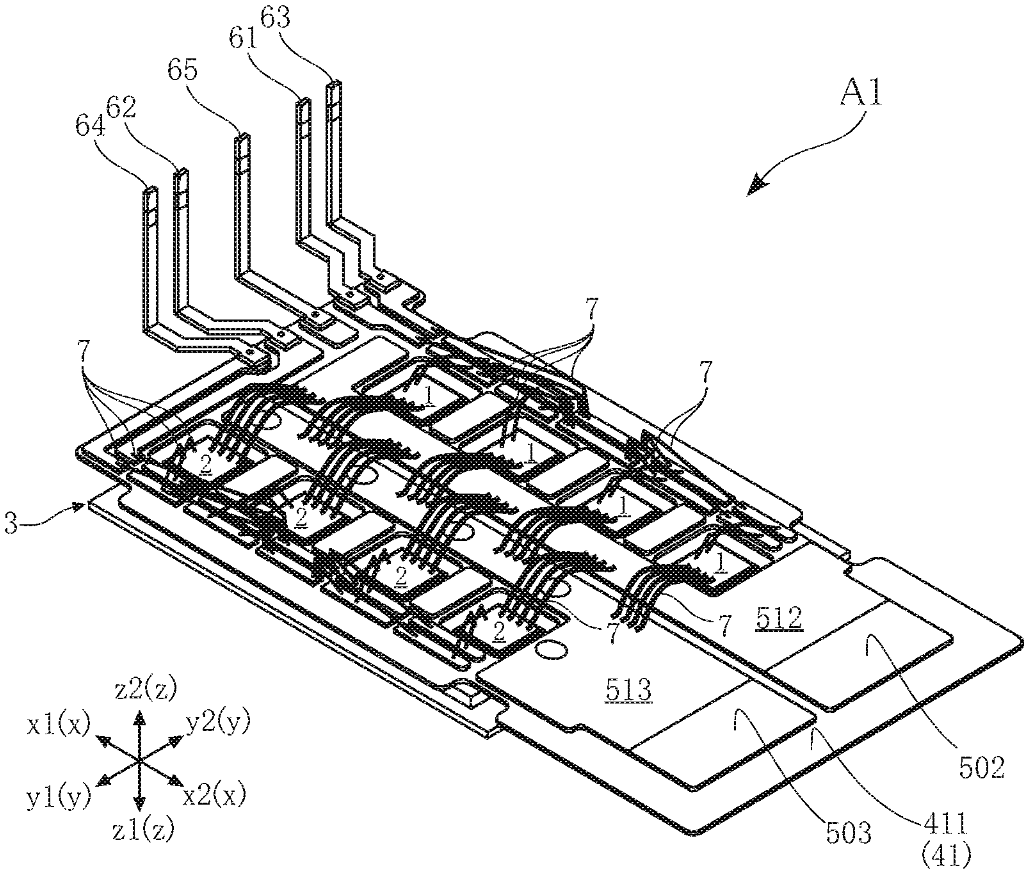
FIG. 2 is a perspective view similar to FIG. 1 but omitting a sealing member.
Figure 3:
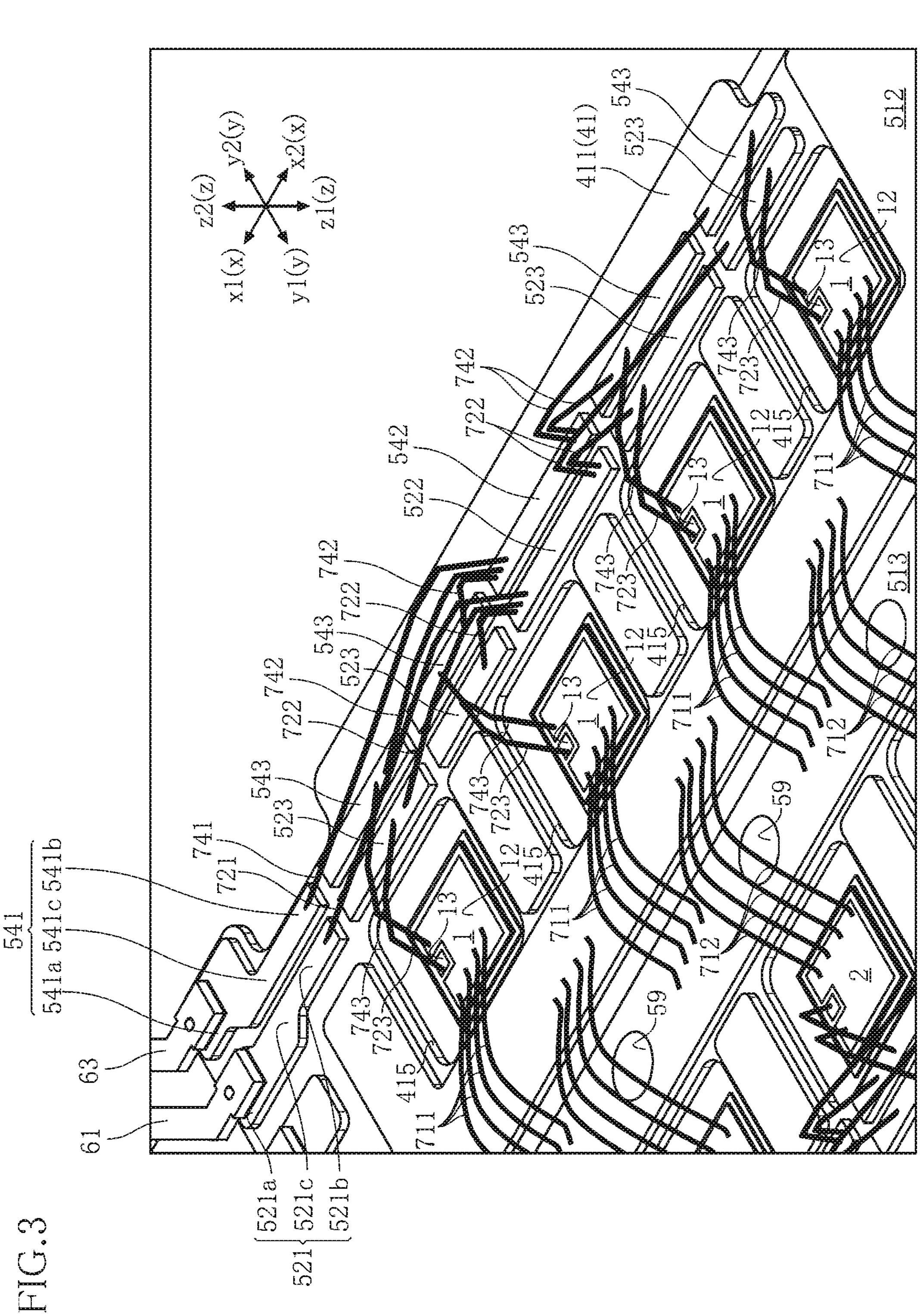
FIG. 3 is an enlarged view of a portion of FIG. 2.
Figure 4:
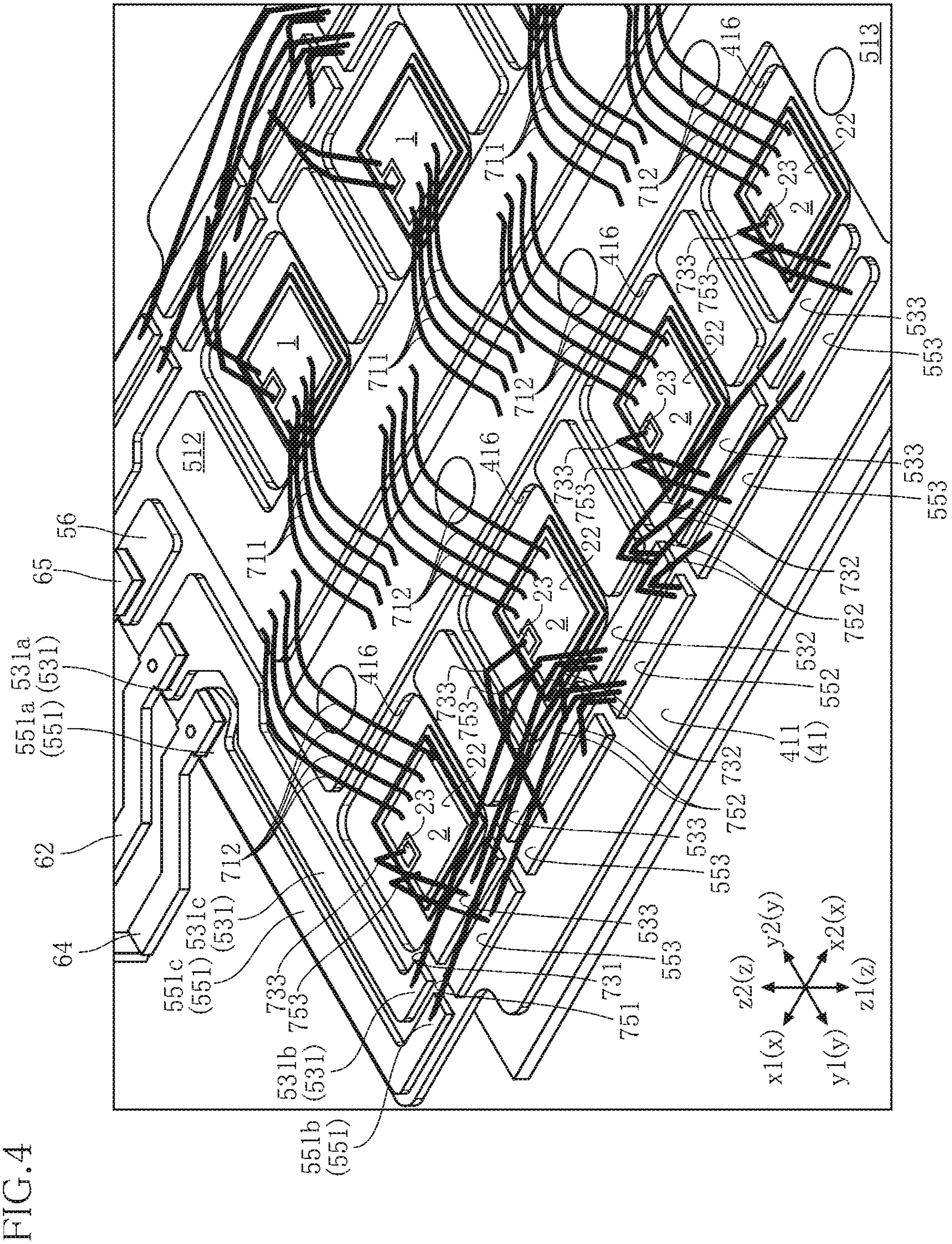
FIG. 4 is an enlarged view of a portion of FIG. 2.

FIGS. 1 to 13 show a semiconductor device A1 according to a first embodiment. The semiconductor device A1 includes a plurality of first semiconductor elements 1, a plurality of second semiconductor elements 2, a supporting member 3, a plurality of insulating substrates 41, a plurality of wiring sections 511 to 514, 521 to 523, 531 to 533, 541 to 543, 551 to 553, 561, 571 and 572, a plurality of metal members 58 and 59, a pair of control terminals 61 and 62, a plurality of detection terminals 63 to 65, a plurality of connecting members 7 and a sealing member 8. As shown in FIGS. 3 and 4, the plurality of connecting members 7 include connecting members 711, 712, 721 to 723, 731 to 733, 741 to 743 and 751 to 753.

Figure 5:
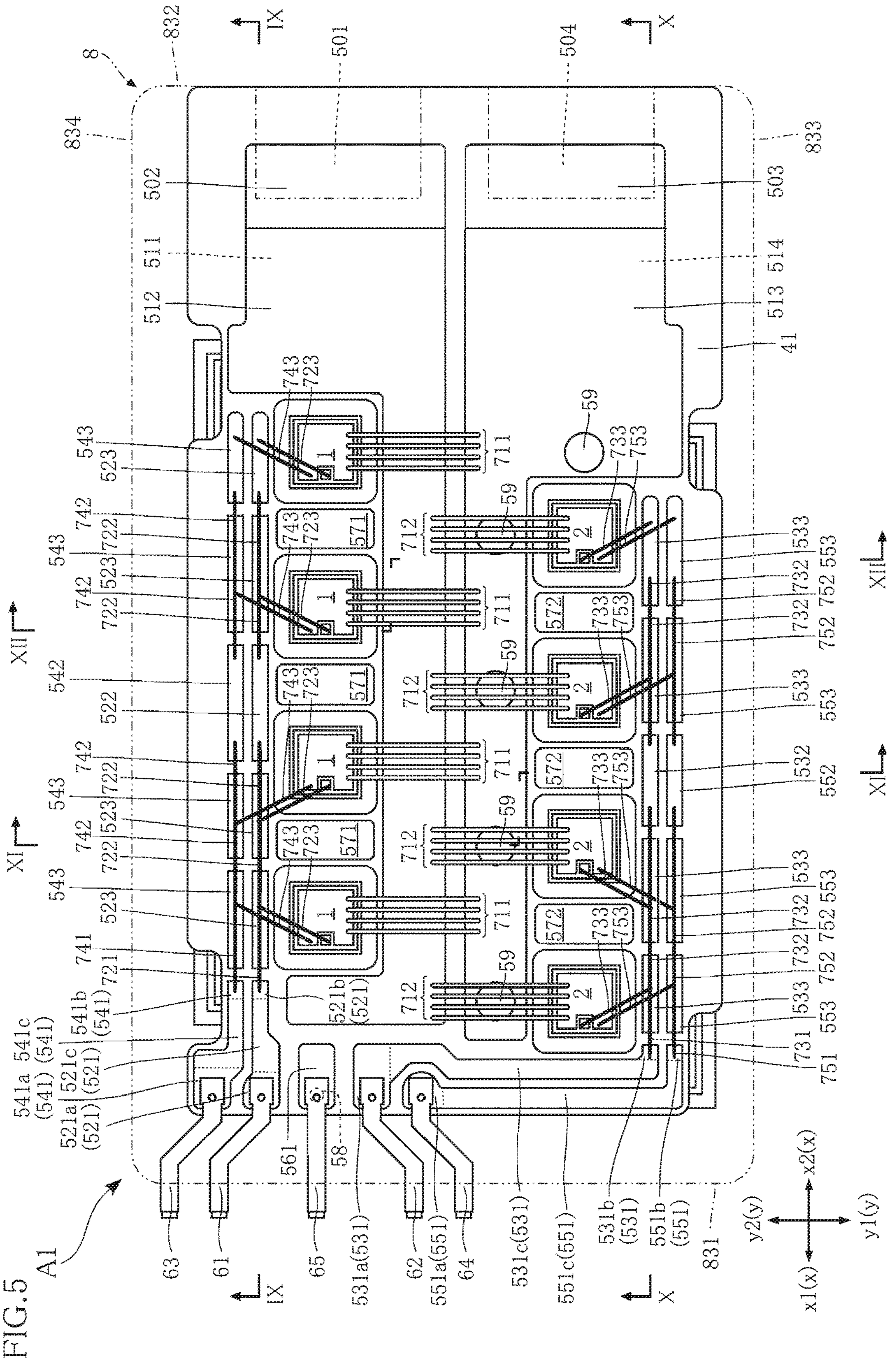
FIG. 5 is a plan view of the semiconductor device according to the first embodiment with the sealing member shown in phantom.
Figure 6:
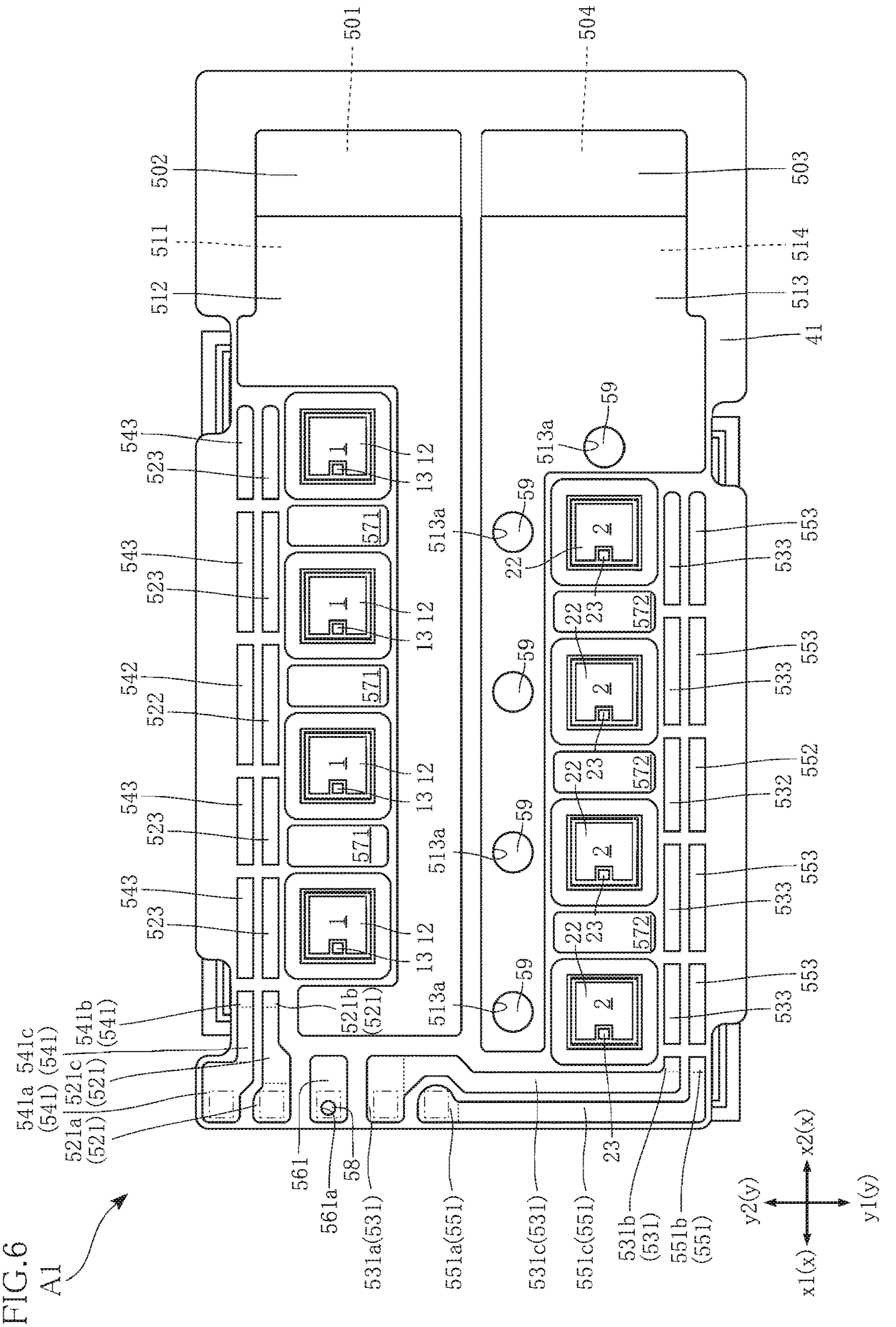
FIG. 6 is a plan view similar to FIG. 5 but omitting a plurality of terminals, a plurality of connecting members and the sealing member.
Figure 7:
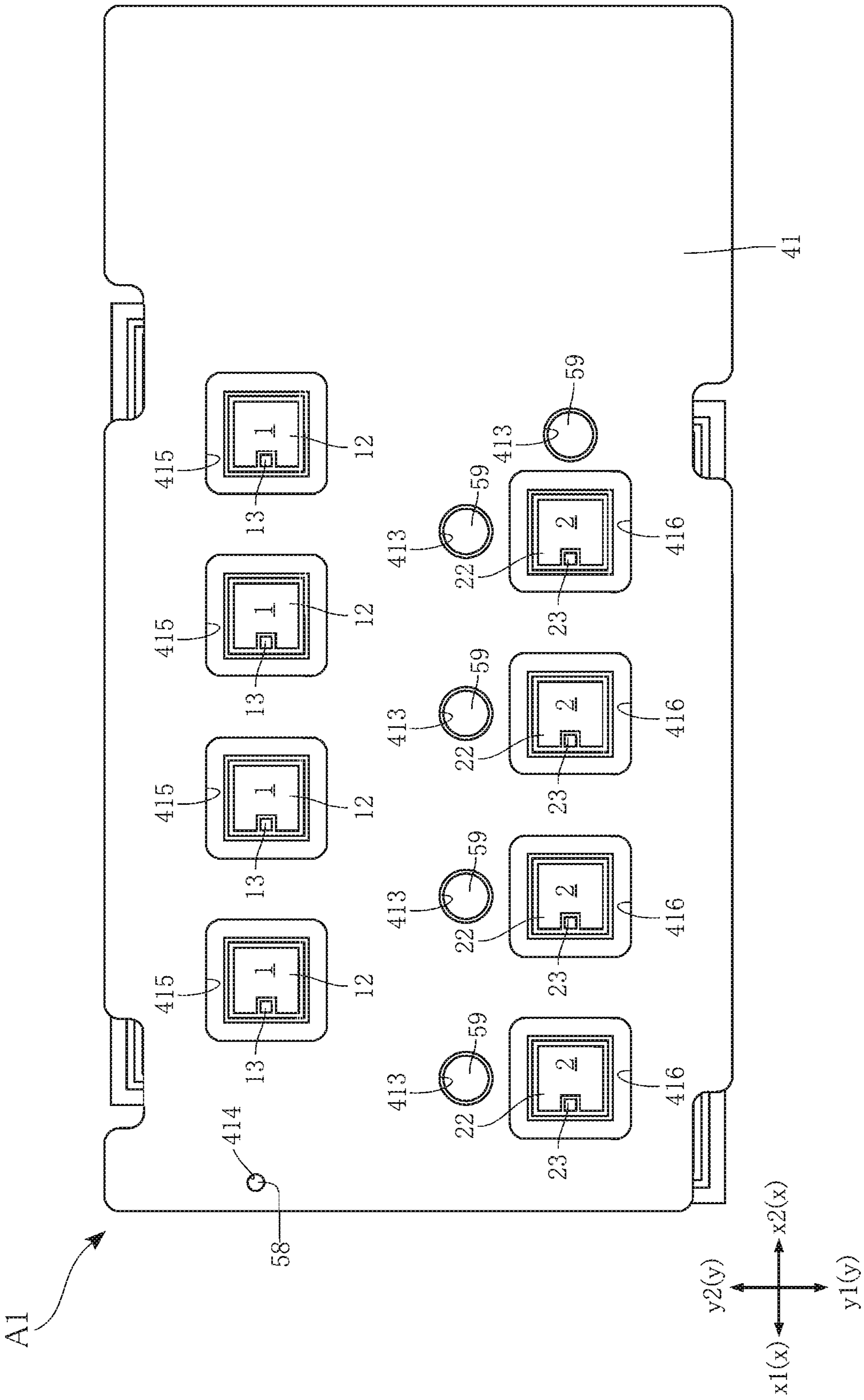
FIG. 7 is a plan view similar to FIG. 6 but omitting some wiring sections.
Figure 8:
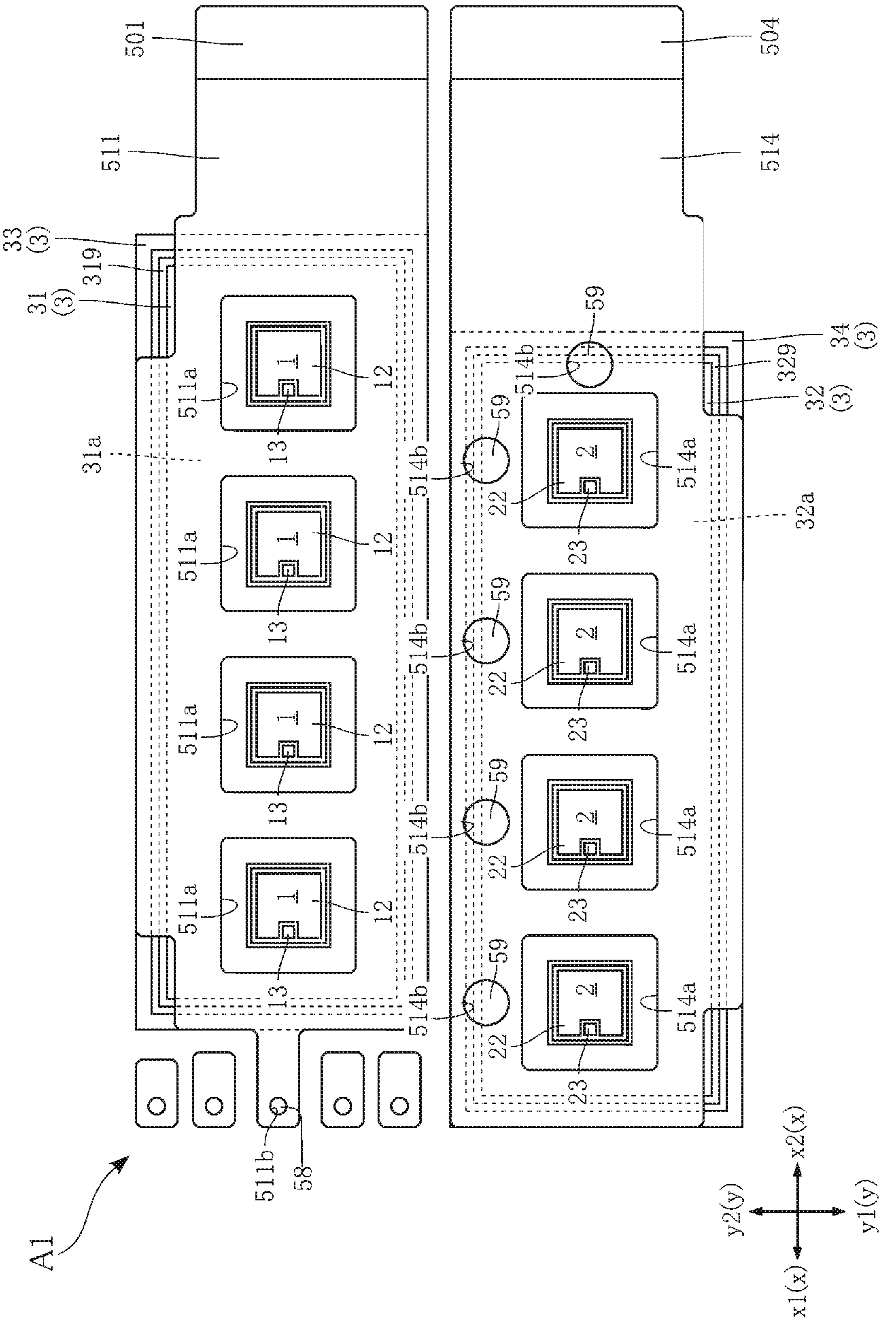
FIG. 8 is a plan view similar to FIG. 7 but omitting an insulating substrate.
Figure 9:
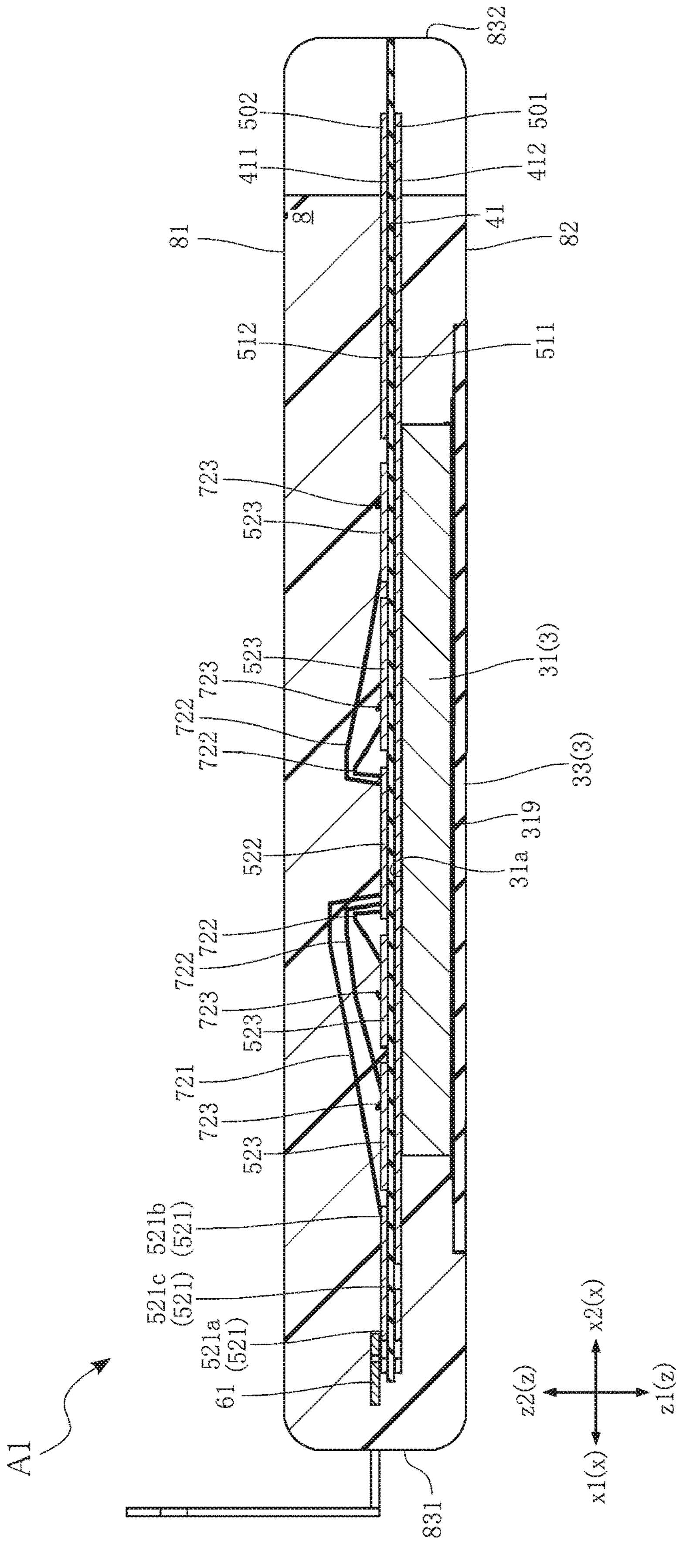
FIG. 9 is a sectional view taken along line IX-IX of FIG. 5.
Figure 10:
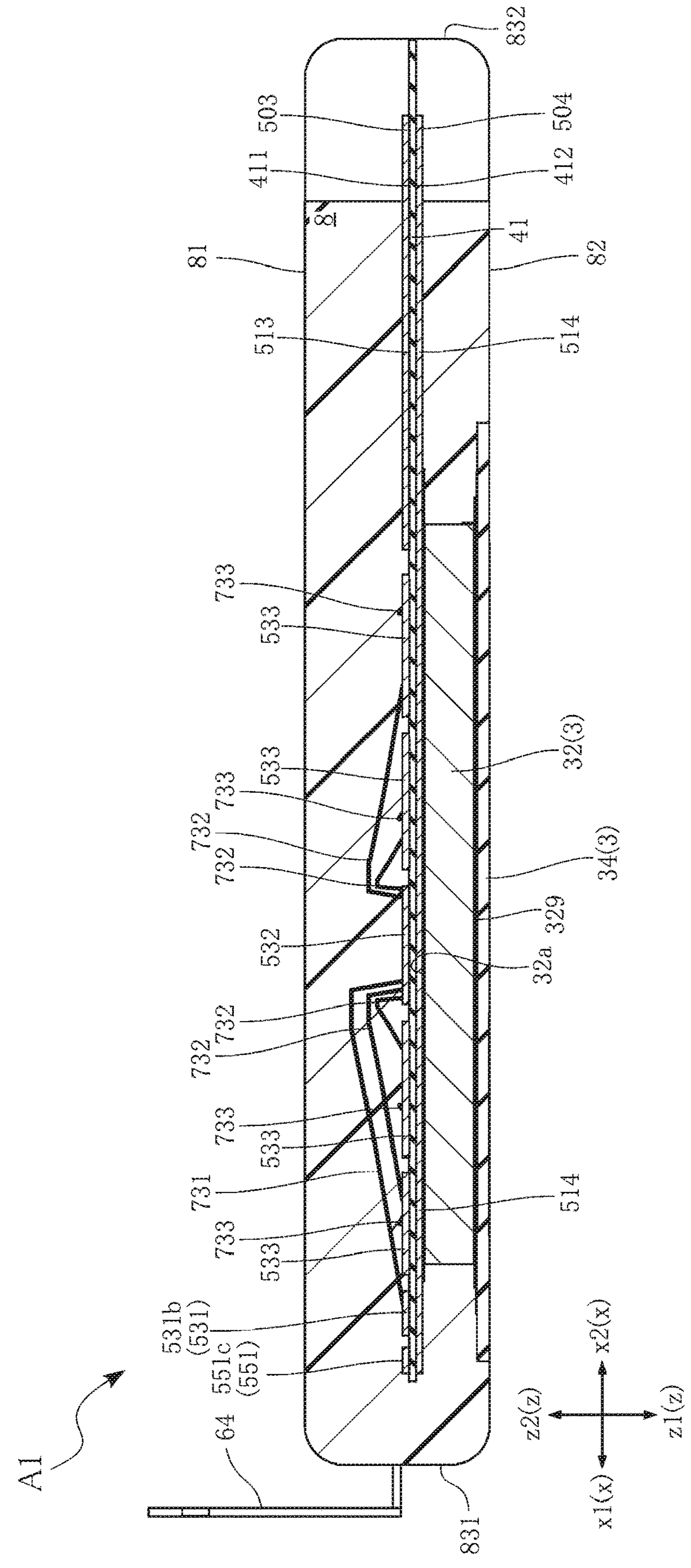
FIG. 10 is a sectional view taken along line X-X of FIG. 5.
Figure 11:
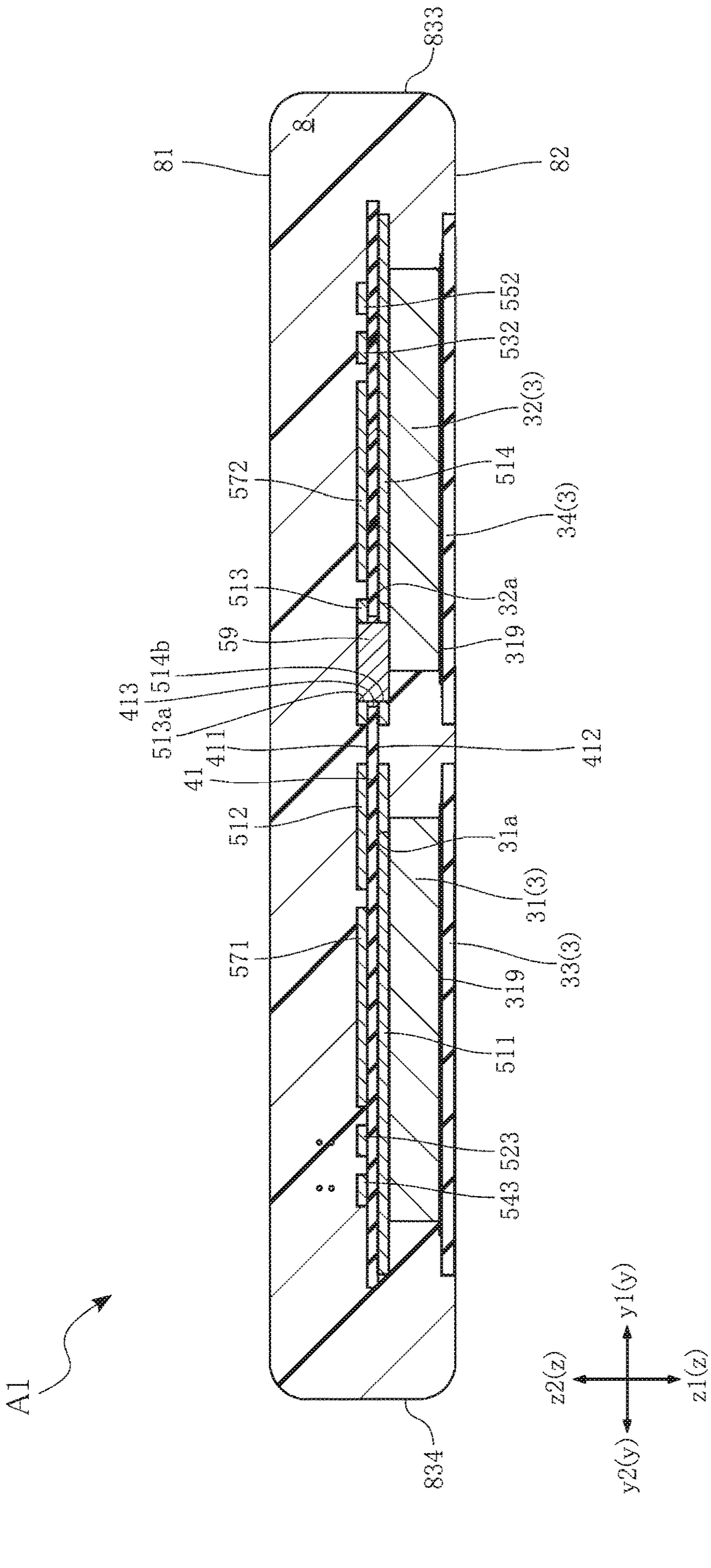
FIG. 11 is a sectional view taken along line XI-XI of FIG. 5.
Figure 12:
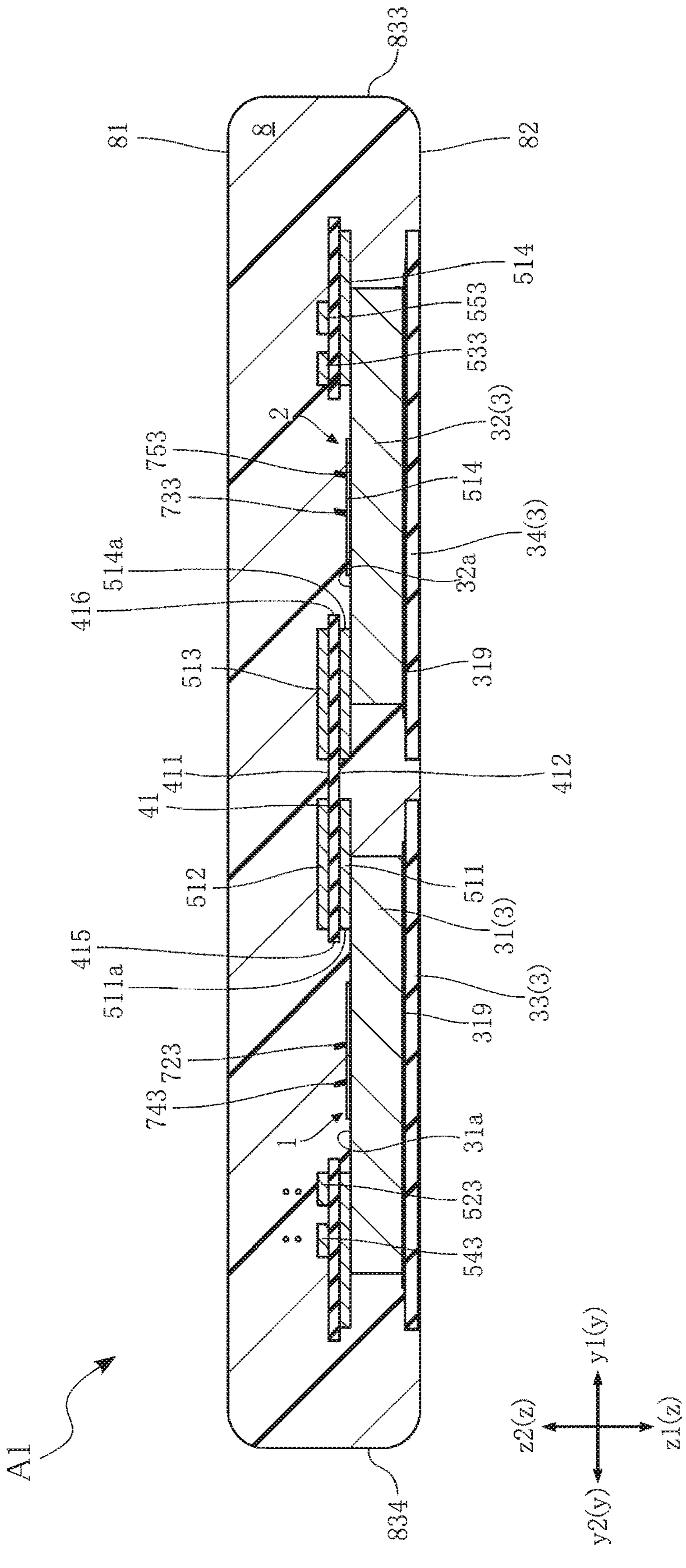
FIG. 12 is a sectional view taken along line XII-XII of FIG. 5.
Figure 13:
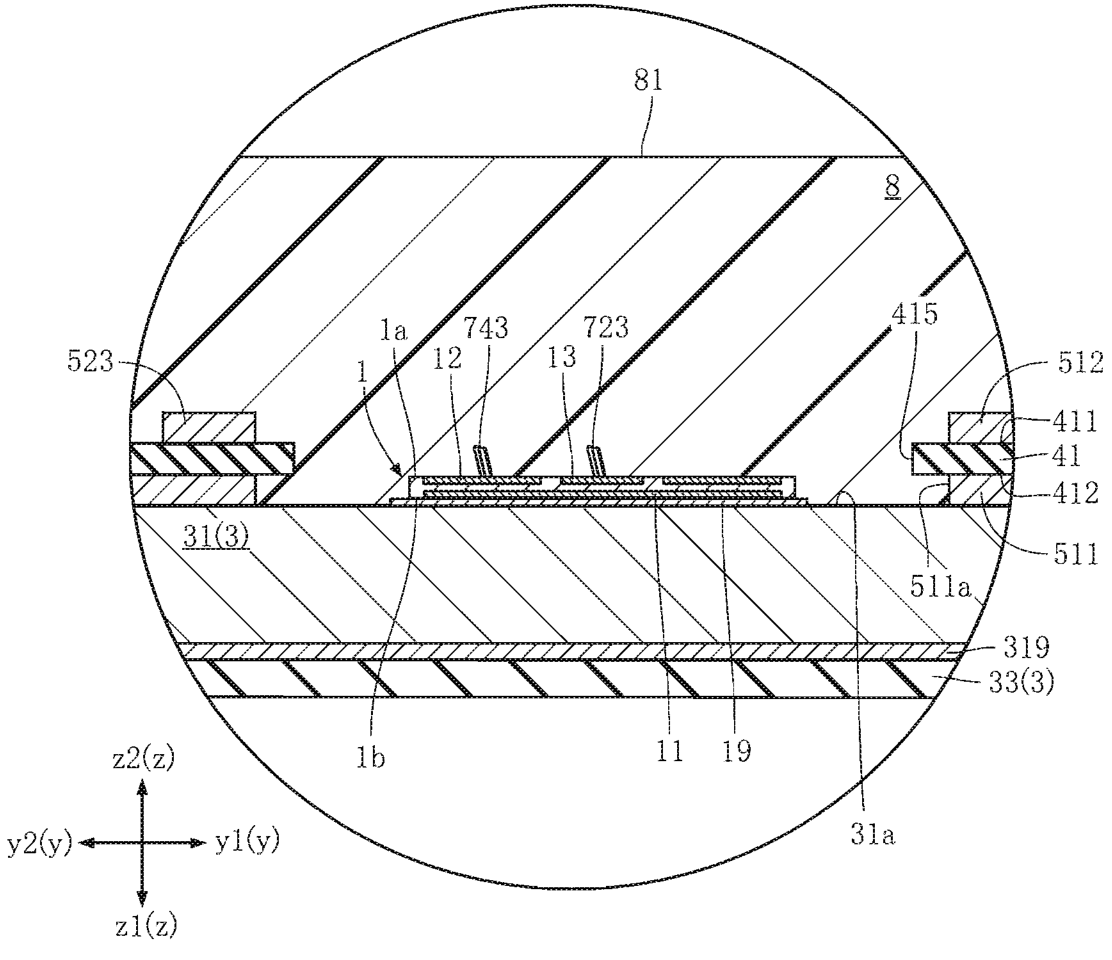
FIG. 13 is an enlarged view of a portion of FIG. 12.
Figure 14:
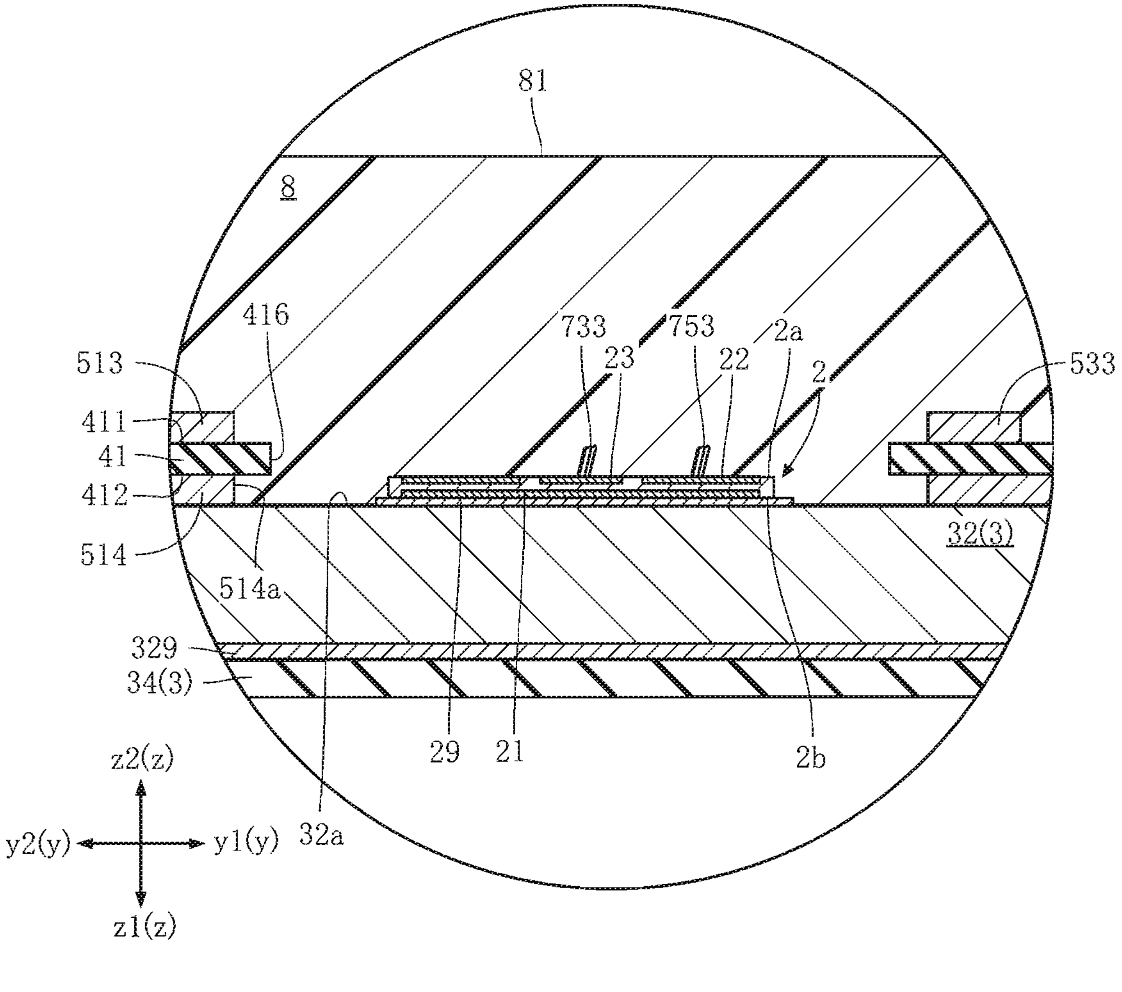
FIG. 14 is an enlarged view of a portion of FIG. 12.

FIG. 1 is a perspective view of the semiconductor device A1. FIG. 2 is a perspective view similar to FIG. 1 but omitting the sealing member 8. FIG. 3 is an enlarged view of an important portion of FIG. 2. FIG. 4 is an enlarged view of an important portion of FIG. 2. FIG. 5 is a plan view of the semiconductor device A1, with the sealing member 8 shown in phantom (two-dot-dash lines). FIG. 6 is a plan view similar to FIG. 5 but omitting the control terminals 61 and 62, the detection terminals 63 to 65 and the connecting members 7. FIG. 7 is a plan view similar to FIG. 6 but omitting the wiring sections 512, 513, 521 to 523, 531 to 533, 541 to 543, 551 to 553, 561, 571 and 572. FIG. 8 is a plan view similar to FIG. 7 but omitting the insulating substrate 41. FIG. 9 is a sectional view taken along line IX-IX of FIG. 5. FIG. 10 is a sectional view taken along line X-X of FIG. 5. FIG. 11 is a sectional view taken along line XI-XI of FIG. 5. FIG. 12 is a sectional view taken along line XII-XII of FIG. 5. FIG. 13 is an enlarged view of an important portion of FIG. 12. FIG. 14 is an enlarged view of a portion of FIG. 12.

For convenience, three mutually orthogonal directions are designated as x, y and z directions. The z direction may be, for example, a thickness direction of the semiconductor device A1. The x direction may be a lateral direction of the semiconductor device A1 in plan view (see FIG. 5). The y direction may be a vertical direction of the semiconductor device A1 in plan view (see FIG. 5). The x direction is an example of a “first direction”, and the y direction as a “second direction”.

In one example, the first semiconductor elements 1 and the second semiconductor elements 2 may be MOSFETs. In another example, the first semiconductor elements 1 and the second semiconductor elements 2 may be switching elements other than MOSFETs, such as field effect transistors, including metal-insulator-semiconductor FETs (MISFETs), or bipolar transistors, including IGBTs. Each of the first semiconductor elements 1 and the second semiconductor elements 2 is made of a semiconductor material, which mostly is silicon carbide (SiC). The semiconductor material is not limited to SiC, and other examples include silicon (Si), gallium arsenide (GaAs), gallium nitride (GaN) and gallium oxide ($Ga_2O_3$).

As shown in FIG. 13, each of the first semiconductor elements 1 has an element obverse surface 1*a* and an element reverse surface 1*b*. The element obverse surface 1*a* and the element reverse surface 1*b* are spaced apart from each other in the z direction. The element obverse surface 1*a* faces in the z2 direction, and the element reverse surface 1*b* faces in the z1 direction. The element obverse surface 1*a* is an example of a “first-element obverse surface”, and the element reverse surface 1*b* is an example of a “first-element reverse surface”.

Each first semiconductor element 1 includes a first electrode 11, a second electrode 12 and a third electrode 13. As shown in FIG. 13, the first electrode 11 of each first semiconductor element 1 is formed on the element reverse surface 1*b*, and the second electrode 12 and the third electrode 13 are formed on the element obverse surface 1*a*. In the example in which each first semiconductor element 1 is an MOSFET, the first electrode 11 is the drain electrode, the second electrode 12 is the source electrode, and the third electrode 13 is the gate electrode. Each first semiconductor element 1 changes between a conducting state and an insulating state in response to a first drive signal (e.g., gate voltage) inputted to the third electrode 13 (the gate electrode). This operation of changing between the conducting state and the insulating state is referred to as a switching operation. In the conducting state, current flows from the first electrode 11 (the drain electrode) to the second electrode 12 (the source electrode). In the insulating state, the current does not flow. That is, each first semiconductor element 1 is controlled to turn on and off the current flow between the first electrode 11 (the drain electrode) and the second electrode 12 (the source electrode) in response to a first drive signal (e.g., gate voltage) inputted to the third electrode 13 (the gate electrode). The first semiconductor elements 1 are arranged as described later to electrically connect the first electrodes 11 with each other and the second electrodes 12 with each other.

As shown in FIGS. 2, 3 and 5, the first semiconductor elements 1 are arranged side by side in the x direction. As shown in FIG. 13, each first semiconductor element 1 is bonded to the supporting member 3 (a conductive plate 31, which will be described later) with a conductive bonding material 19. The conductive bonding material 19 may be solder, metal paste or sintered metal.

As shown in FIG. 14, each of the second semiconductor elements 2 has an element obverse surface 2*a* and an element reverse surface 2*b*. The element obverse surface 2*a* and the element reverse surface 2*b* are spaced apart from each other in the z direction. The element obverse surface 2*a* faces in the z2 direction, and the element reverse surface 2*b* faces in the z1 direction. The element obverse surface 2*a* is an example of a “second-element obverse surface”, and the element reverse surface 2*b* is an example of a “second-element reverse surface”.

Each second semiconductor element 2 includes a fourth electrode 21, a fifth electrode 22 and a sixth electrode 23. As shown in FIG. 14, the fourth electrode 21 of each second semiconductor element 2 is formed on the element reverse surface 2*b*, and the fifth electrode 22 and the sixth electrode 23 are formed on the element obverse surface 2*a*. In the example in which each second semiconductor element 2 is an MOSFET, the fourth electrode 21 is the drain electrode, the fifth electrode 22 is the source electrode and the sixth electrode 23 is the gate electrode. The second semiconductor element 2 performs switching operations (changes between a conducting state and an insulating state) in response to a second drive signal (e.g., gate voltage) inputted to the sixth electrode 23 (the gate electrode). In the conducting state, current flows from the fourth electrode 21 (the drain electrode) to the fifth electrode 22 (the source electrode). In the insulating state, the current does not flow. That is, the second semiconductor element 2 is controlled to turn on and off the current flow between the fourth electrode 21 (the drain electrode) and the fifth electrode 22 (the source electrode) in response to a second drive signal (e.g., gate voltage) inputted to the sixth electrode 23 (the gate electrode). The second semiconductor elements 2 are arranged as described later to electrically connect the fourth electrodes 21 with each other and the fifth electrodes 22 with each other.

As shown in FIGS. 2, 4 and 5, the second semiconductor elements 2 are arranged side by side in the x direction. The second semiconductor elements 2 are located in the y1 direction from the first semiconductor elements 1. As shown in FIG. 14, each second semiconductor element 2 is bonded to the supporting member 3 (a conductive plate 32, which will be described later) with a conductive bonding material 29. The conductive bonding material 29 may be solder, metal paste or sintered metal.

The semiconductor device A1 may be configured as a half-bridge switching circuit, for example. The first semiconductor elements 1 form an upper arm circuit of the semiconductor device A1, and the second semiconductor elements 2 form a lower arm circuit of the semiconductor device A1. For the semiconductor device A1, the first semiconductor elements 1 are electrically connected in parallel, and the second semiconductor elements 2 are electrically connected in parallel. Each first semiconductor element 1 is connected in series with one of the second semiconductor elements 2 by electrically connecting the second electrode 12 and the fourth electrode 21. With this serial connection, the first semiconductor elements 1 and the second semiconductor elements 2 form a bridge. In the illustrated example, the semiconductor device A1 includes four first semiconductor elements 1 and four second semiconductor elements 2 (see FIGS. 2 and 5). The numbers of the first semiconductor elements 1 and the second semiconductor elements 2 to be provided are not limited to this example, and may be changed depending on the desired performance of the semiconductor device A1.

As shown in FIGS. 8 to 14, the supporting member 3 supports the first semiconductor elements 1 and the second semiconductor elements 2. The supporting member 3 includes a pair of conductive plates 31 and 32 and a pair of insulating plates 33 and 34.

Each of the conductive plates 31 and 32 is made of an electrically conductive material, such as copper or a copper alloy. Each of the conductive plates 31 and 32 may be a laminate in which a layer of copper and a layer of molybdenum are alternately stacked in the z direction. In this case, the outer layers of each of the conductive plates 31 and 32 in the z1 direction and the z2 direction are formed by copper layers. As shown in FIG. 8, the conductive plates 31 and 32 may be rectangular as viewed in the z direction (in plan view).

As shown in FIGS. 8, 12 and 13, the conductive plate 31 supports the first semiconductor elements 1 mounted thereon. The conductive plate 31 is electrically connected to the first electrodes 11 (the drain electrodes) of the first semiconductor elements 1. The first electrodes 11 of the first semiconductor elements 1 are electrically connected to each other via the conductive plate 31. The conductive plate 31 may have the shape of a rectangular parallelepiped, for example. The conductive plate 31 has a larger z-direction dimension than the z-direction dimension of the insulating substrate 41. The conductive plate 31 is an example of a "first mounting portion".

As shown in FIGS. 9 and 11 to 13, the conductive plate 31 has a mounting surface 31*a*. The mounting surface 31*a* faces in the z2 direction. The mounting surface 31*a* has the first semiconductor elements 1 bonded thereto and also has the wiring section 511 bonded thereto. The conductive plate 31 is bonded to the insulating plate 33 with the bonding material 319 as shown in FIGS. 9 and 13. The bonding material 319 may be electrically conductive or insulating.

As shown in FIGS. 8, 12 and 14, the conductive plate 32 supports the second semiconductor elements 2 mounted thereon. The conductive plate 32 is electrically connected to the fourth electrodes 21 (the drain electrodes) of the second semiconductor elements 2. The fourth electrodes 21 of the second semiconductor elements 2 are electrically connected to each other via the conductive plate 32. The conductive plate 32 may have the shape of a rectangular parallelepiped, for example. The conductive plate 32 has a larger z-direction dimension than the z-direction dimension of the insulating substrate 41. The conductive plate 32 is an example of a "second mounting portion".

As shown in FIGS. 10, 12 and 14, the conductive plate 32 has a mounting surface 32*a*. The mounting surface 32*a* faces in the z2 direction. The mounting surface 32*a* has the second semiconductor elements 2 bonded thereto and also has the wiring section 514 bonded thereto. The conductive plate 32 is bonded to the insulating plate 34 with the bonding material 329 as shown in FIGS. 10 and 14. The bonding material 329 may be electrically conductive or insulating.

The insulating plates 33 and 34 are each made of an insulating material, such as $Al_2O_3$. As shown in FIG. 8, the insulating plates 33 and 34 may be rectangular in plan view. As shown in FIGS. 8, 9 and 11 to 13, the insulating plate 33 supports the conductive plate 31. As shown in FIGS. 8, 10 to 12 and 14, the insulating plate 34 supports the conductive plate 32. Each of the insulating plates 33 and 34 may have a plating layer covering the surface to which the conductive plate 31 or 32 is bonded. The plating layer may be made of silver or a silver alloy.

The insulating substrate 41 is made of an insulating material, which is a glass epoxy resin in one example. In another example, the insulating substrate 41 may be made of a ceramic material, such as aluminum nitride (AlN), silicon nitride (SiN) or aluminum oxide ($Al_2O_3$), instead of a glass epoxy resin. The insulating substrate 41 is an example of an "insulating substrate".

As shown in FIGS. 9 to 14, the insulating substrate 41 has an obverse surface 411 and a reverse surface 412. The obverse surface 411 and the reverse surface 412 are spaced apart in the z direction. The obverse surface 411 faces in the z2 direction, and the reverse surface 412 faces in the z1 direction. The obverse surface 411 is an example of a "substrate obverse surface", and the reverse surface 412 is an example of a "substrate reverse surface".

As shown in FIGS. 7 and 11 to 14, the insulating substrate 41 includes a plurality of through-holes 413, a through-hole 414, a plurality of openings 415 and a plurality of openings 416.

As shown in FIG. 11, the through-holes 413 extend in the z direction through the insulating substrate 41 from the obverse surface 411 to the reverse surface 412. As shown in FIGS. 7 and 11, each through-hole 413 has a metal member 59 inserted therein. As shown in FIGS. 7 and 11, the inner surface of the through-hole 413 is not in contact with the metal member 59. In a different example, the inner surface of each through-hole 413 may be in contact with the metal member 59. The phrase that a component is "inserted in" a through-hole used in the present disclosure refers to a state in which the component (e.g., a metal member 59) is placed inside the through-hole (e.g., a through-hole 413) without specifying whether the component is in contact with the inner surface of the through-hole. An insulating member different from the insulating substrate 41 may be present in a clearance between a metal member 59 and a through-hole 413.

The through-hole 414 extends in the z direction through the insulating substrate 41 from the obverse surface 411 to the reverse surface 412. As shown in FIG. 7, the through-hole 414 has a metal member 58 inserted therein. In the illustrated example, the inner surface of the through-hole 414 is in contact with the metal member 58 (see FIG. 7). In another example, the contact is not made.

As shown in FIGS. 7, 12 and 13, the openings 415 extend in the z direction through the insulating substrate 41 from the obverse surface 411 to the reverse surface 412. As shown in FIG. 7, each opening 415 surrounds a first semiconductor element 1 in plan view. Each opening 415 is an example of a "first opening".

As shown in FIGS. 7, 12 and 14, the openings 416 extend in the z direction through the insulating substrate 41 from the obverse surface 411 to the reverse surface 412. As shown in FIG. 7, each opening 416 surrounds a second semiconductor element 2 in plan view. Each opening 416 is an example of a "second opening".

The wiring sections 511 to 514, 521 to 523, 531 to 533, 541 to 543, 551 to 553 and 561 form conduction paths of the semiconductor device A1, together with portions of the supporting member 3 (the conductive plates 31 and 32), the metal members 58 and 59 and the connecting members 711, 712, 721 to 723, 731 to 733, 741 to 743 and 751 to 753. The wiring sections 511 to 514, 521 to 523, 531 to 533, 541 to 543, 551 to 553, 561, 571 and 572 are spaced apart from each other. The wiring sections 511 to 514, 521 to 523, 531 to 533, 541 to 543, 551 to 553, 561, 571 and 572 are made of copper or a copper alloy. The thickness (the z-direction dimension) and the material of the wiring sections 511 to 514, 521 to 523, 531 to 533, 541 to 543, 551 to 553, 561, 571 and 572 may be changed as necessary, depending on the specifications of the semiconductor device A1 (the rated and allowable currents, the rated and withstand voltages, the internal inductance of the overall device, the device size, etc.).

The wiring sections 511 to 514 form the conduction paths for the principal current of the semiconductor device A1. In plan view, the wiring sections 511 and 512 of the semiconductor device A1 overlap with each other, and the wiring sections 513 and 514 overlap with each other.

The wiring section 511 is formed on the reverse surface 412 of the insulating substrate 41. As shown in FIGS. 9 and 11 to 13, the wiring section 511 is bonded to the mounting surface 31*a* of the conductive plate 31. The wiring section 511 is electrically connected to the first electrodes 11 (the drain electrodes) of the first semiconductor elements 1 via the conductive plate 31.

As shown in FIGS. 8 12 and 13, the wiring section 511 includes a plurality of openings 511*a* and a through-hole 511*b*. As shown in FIGS. 12 and 13, the openings 511*a* extend in the z direction through the wiring section 511. As can be seen from FIGS. 12 and 13, each opening 511*a* overlaps with an opening 415 of the insulating substrate 41 in plan view. As shown in FIG. 8, each opening 511*a* surrounds a first semiconductor element 1 in plan view. The through-hole 511*b* extends in the z direction through the wiring section 511. As shown in FIG. 8, the through-hole 511*b* has a metal member 58 fitted therein.

The wiring section 512 is formed on the obverse surface 411 of the insulating substrate 41. As can be seen from FIGS. 5 and 6, the wiring section 512 is electrically connected to the fifth electrode 22 (the source electrode) of each second semiconductor element 2 via a plurality of connecting members 712. In plan view, the wiring section 512 is shaped so as to avoid the region where the first semiconductor elements 1 are located.

The wiring section 513 is formed on the obverse surface 411 of the insulating substrate 41. The wiring section 513 is located in the y1 direction from the wiring section 512 in plan view. As can be seen from FIGS. 5 and 6, the wiring section 513 is electrically connected to the second electrode 12 (the source electrode) of each first semiconductor element 1 via a plurality of connecting members 711. Additionally, the wiring section 513 is electrically connected to the fourth electrodes 21 (the drain electrodes) of the second semiconductor elements 2 via the wiring section 514 and the metal members 59 as will be detailed later. In plan view, the wiring section 513 is shaped to avoid the region where the second semiconductor elements 2 are located.

As shown in FIGS. 6 and 11, the wiring section 513 includes a plurality of through-holes 513*a*. As shown in FIGS. 6 and 11, each through-hole 513*a* has a metal member 59 fitted therein. As shown in FIGS. 6 and 11, the inner surface of the through-hole 513*a* is in contact with the metal member 59. The phrase that a component is "fitted in" a through-hole used in the present disclosure refers to a state in which the component (e.g., a metal member 59) is placed inside the through-hole (e.g., a through-hole 513) and in contact with the inner surface of the through-hole. That is, the state of a component being "fitted in" a through-hole corresponds to one state of the component being "inserted in" the through-hole, in which case the component is in contact with the inner surface of the through-hole. In the illustrated example, the through-holes 513*a* have a circular shape in plan view (see FIG. 6), but the shape may be changed depending on the shape of the metal members 59.

The wiring section 514 is formed on the reverse surface 412 of the insulating substrate 41. As shown in FIGS. 8, 10 to 12 and 14, the wiring section 514 is bonded to the mounting surface 32*a* of the conductive plate 32. The wiring section 514 is electrically connected to the fourth electrodes 21 (the drain electrodes) of the second semiconductor elements 2 via the conductive plate 32. Additionally, the wiring section 514 is electrically connected to the second electrodes 12 (the source electrodes) of the first semiconductor elements 1 via the wiring section 513 and the metal members 59 as will be detailed later.

As shown in FIGS. 8, 11, 12 and 14, the wiring section 514 includes a plurality of openings 514*a* and a plurality of through-holes 514*b*. As shown in FIG. 12, the openings 514*a* extend in the z direction through the wiring section 514. As can be seen from FIGS. 12 and 14, each opening 514*a* overlaps with an opening 416 of the insulating substrate 41 in plan view. As shown in FIG. 8, each opening 514*a* surrounds a second semiconductor element 2 in plan view. As shown in FIG. 11, the through-holes 514*b* extend in the z direction through the wiring section 514. Each through-hole 514*b* overlaps with a through-hole 513*a* of the wiring section 513 in plan view. Each through-hole 514*b* has a metal member 59 fitted therein.

As shown in FIG. 8, the wiring section 511 of the semiconductor device A1 includes a first power-terminal portion 501. The first power-terminal portion 501 is located at the end of the wiring section 511 in the x2 direction. Being a part of the wiring section 511, the first power-terminal portion 501 is electrically connected to the first electrodes 11 (the drain electrodes) of the first semiconductor elements 1. As shown in FIGS. 2, 5 and 6, the wiring section 512 includes a second power-terminal portion 502. The second power-terminal portion 502 is located at the end of the wiring section 512 in the x2 direction. Being a part of the wiring section 512, the second power-terminal portion 502 is electrically connected to the fifth electrodes 22 (the source electrodes) of the second semiconductor elements 2. As shown in FIGS. 2, 5 and 6, the wiring section 513 includes a third power-terminal portion 503. The third power-terminal portion 503 is located at the end of the wiring section 513 in the x2 direction. Being a part of the wiring section 513, the third power-terminal portion 503 is electrically connected to the second electrodes 12 (the source electrodes) of the first semiconductor elements 1 and the fourth electrodes 21 (the drain electrodes) of the second semiconductor elements 2. As shown in FIG. 8, the wiring section 514 includes a fourth power-terminal portion 504. The fourth power-terminal portion 504 is located at the end of the wiring section 514 in the x2 direction. Being a part of the wiring section 514, the fourth power-terminal portion 504 is electrically connected to the second electrodes 12 (the source electrodes) of the first semiconductor elements 1 and the fourth electrodes 21 (the drain electrodes) of the second semiconductor elements 2.

The first power-terminal portion 501, the second power-terminal portion 502, the third power-terminal portion 503 and the fourth power-terminal portion 504 are spaced apart from each other and exposed from the sealing member 8. The first to fourth power-terminal portions 501, 502, 503 and 504 may or may not be plated.

The first power-terminal portion 501 and the second power-terminal portion 502 overlap with each other in in plan view. The third power-terminal portion 503 and the fourth power-terminal portion 504 overlap with each other in in plan view. Although the semiconductor device A1 in the illustrated example includes the third power-terminal portion 503 and the fourth power-terminal portion 504, only one of the third power-terminal portion 503 and the fourth power-terminal portion 504 may be included in a different example.

The first power-terminal portion 501 and the second power-terminal portion 502 are connected to an external direct-current source that applies a source voltage (direct-current voltage) to the terminals. In the semiconductor device A1, the first power-terminal portion 501 is a P terminal to be connected to the positive terminal of a direct-current voltage source, and the second power-terminal portion 502 is an N terminal to be connected to the negative terminal of the direct-current voltage source. The direct-current voltage applied across the first power-terminal portion 501 and the second power-terminal portion 502 is converted to alternating-current voltage by the switching operations of the first semiconductor elements 1 and the second semiconductor elements 2. The converted voltage (the alternating-current voltage) is outputted from the third power-terminal portion 503 and the fourth power-terminal portion 504. The principal current of the semiconductor device A1 is caused by the source voltage and the converted voltage.

In the semiconductor device A1, the wiring sections 521 to 523, 531 to 533, 541 to 543, 551 to 553 and 561 form conduction paths of a control signal.

The wiring section 521 is formed on the obverse surface 411 of the insulating substrate 41. As shown in FIG. 5, the control terminal 61 is electrically bonded to the wiring section 521. The wiring section 521 is an example of a "first wiring section". As shown in FIGS. 5 and 6, the wiring section 521 includes two pad portions 521*a* and 521*b* and an interconnecting portion 521*c*. The pad portion 521*a* is where the control terminal 61 is bonded. The pad portion 521*b* is where an end of the connecting member 721 is bonded. The pad portion 521*b* is located on one side in the x direction (the x2 direction in the example shown in FIGS. 5 and 6) with respect to the pad portion 521*a*. The interconnecting portion 521*c* connects the two pad portions 521*a* and 521*b*.

The wiring section 522 is formed on the obverse surface 411 of the insulating substrate 41. As shown in FIGS. 5 and 6, the wiring section 522 has a strip shape elongated in the x direction in plan view. The wiring section 522 has the connecting members 721 and 722 bonded thereto. The wiring section 522 is electrically connected to the wiring section 521 with the connecting member 721. The wiring section 522 is an example of a "second wiring section".

The wiring sections 523 are formed on the obverse surface 411 of the insulating substrate 41. As shown in FIGS. 5 and 6, each wiring section 523 has a strip shape elongated in the x direction in plan view. Each wiring section 523 has a connecting member 722 and a connecting member 723 bonded thereto. Each wiring section 523 is electrically connected to the third electrode 13 (the gate electrode) of a first semiconductor element 1 via a connecting member 723. Each wiring section 523 is an example of a "third wiring section".

As shown in FIGS. 3, 5 and 6, the wiring section 522 and the wiring sections 523 are aligned in the x direction. The wiring sections 522 and 523 are located on one side in the x direction (the x2 direction) with respect to the pad portion 521*b*, overlapping with the pad portion 521*b* as viewed in the x direction. The wiring sections 523 include one located on one side in the x direction (the x1 direction) with respect to the wiring section 522 and one on the other side in the x direction (the x2 direction) (see FIGS. 5 and 6). In the illustrated example, four wiring sections 523 are included, and two of the wiring sections 523 are located in the x1 direction from the wiring section 522, and the other two wiring sections 523 are located in the x2 direction from the wiring section 522. In other words, the semiconductor device A1 includes the same number of wiring sections 523 on either side of the wiring section 522. The locations of the wiring section 523 relative to the wiring section 522 in the x direction may be changed as necessary. For example, different numbers of wiring sections 523 may be provided on the x1-direction side and on the x2-direction side with respect to the wiring section 522. The wiring sections 522 and 523 are located on the side opposite the second semiconductor elements 2 in the y direction (i.e., located in the y2 direction) with respect to the first semiconductor elements 1.

The wiring section 531 is formed on the obverse surface 411 of the insulating substrate 41. As shown in FIG. 5, the control terminal 62 is electrically bonded to the wiring section 531. The wiring section 531 is an example of a "seventh wiring section". As shown in FIGS. 5 and 6, the wiring section 531 includes two pad portions 531*a* and 531*b* and an interconnecting portion 531*c*. The pad portion 531*a* is where the control terminal 62 is bonded. The pad portion 531*b* is where an end of the connecting member 731 is bonded. The pad portion 531*b* is located on one side in the x direction (the x2 direction in the example shown in FIGS. 5 and 6) with respect to the pad portion 531*a*. The interconnecting portion 531*c* connects the two pad portions 531*a* and 531*b*.

The wiring section 532 is formed on the obverse surface 411 of the insulating substrate 41. As shown in FIGS. 5 and 6, the wiring section 532 has a strip shape elongated in the x direction in plan view. The wiring section 532 has the connecting members 731 and 732 bonded thereto. The wiring section 532 is electrically connected to the wiring section 531 with the connecting member 731. The wiring section 532 is an example of an “eight wiring section”.

The wiring sections 533 are formed on the obverse surface 411 of the insulating substrate 41. As shown in FIGS. 5 and 6, the wiring sections 533 have a strip shape elongated in the x direction in plan view. Each wiring section 533 has a connecting member 732 and are connecting member 733 bonded thereto. Each wiring section 533 is electrically connected to the sixth electrode 23 (the gate electrode) of a second semiconductor element 2 with a connecting member 733. The wiring section 533 is an example of a “ninth wiring section”.

As shown in FIGS. 4 to 6, the wiring section 532 and the wiring sections 533 are aligned in the x direction. The wiring sections 532 and 533 are located on one side in the x direction (the x2 direction) with respect to the pad portion 531*b*, overlapping with the pad portion 531*b* as viewed in the x direction. The wiring sections 533 include one located on one side in the x direction (the x1 direction) with respect to the wiring section 532 and one on the other side in the x direction (the x2 direction) (see FIGS. 5 and 6). In the illustrated example, four wiring sections 533 are included, and two of the wiring sections 533 are located in the x1 direction from the wiring section 532 and the other two wiring sections 533 are located in the x2 direction from the wiring section 532. In other words, the semiconductor device A1 includes the same number of wiring sections 533 on either side of the wiring section 532. The locations of the wiring section 533 relative to the wiring section 532 in the x direction may be changed as necessary. For example, different numbers of wiring sections 533 may be provided on the x1-direction side and on the x2-direction side with respect to the wiring section 532. The wiring sections 532 and 533 are located on the side opposite the first semiconductor elements 1 in the y direction (i.e., located in the y1 direction) with respect to the second semiconductor elements 2.

The wiring section 541 is formed on the obverse surface 411 of the insulating substrate 41. As shown in FIG. 5, the detection terminal 63 is electrically bonded to the wiring section 541. The wiring section 541 is an example of a “fourth wiring section”. As shown in FIGS. 5 and 6, the wiring section 541 includes two pad portions 541*a* and 541*b* and an interconnecting portion 541*c*. The pad portion 541*a* is where the detection terminal 63 is bonded. The pad portion 541*b* is where an end of the connecting member 741 is bonded. The pad portion 541*b* is located on one side in the x direction (in the x2 direction in the example shown in FIGS. 5 and 6) with respect to the pad portion 541*a*. The interconnecting portion 541*c* connects the two pad portions 541*a* and 541*b*.

The wiring section 542 is formed on the obverse surface 411 of the insulating substrate 41. As shown in FIGS. 5 and 6, the wiring section 542 has a strip shape elongated in the x direction in plan view. The wiring section 542 has the connecting members 741 and 742 bonded thereto. The wiring section 542 is electrically connected to the wiring section 541 via the connecting member 741. As shown in FIGS. 5 and 6, the wiring sections 522 and 542 are next to each other in the y direction and longitudinally parallel to each other. The wiring section 542 is an example of a “fifth wiring section”.

The wiring sections 543 are formed on the obverse surface 411 of the insulating substrate 41. As shown in FIGS. 5 and 6, each wiring section 543 has a strip shape elongated in the x direction in plan view. Each wiring section 543 has a connecting member 742 and a connecting member 743 bonded thereto. Each wiring section 543 is electrically connected to the second electrode 12 (the source electrode) of a first semiconductor element 1 with the connecting member 743. The wiring section 543 is an example of a “sixth wiring section”.

As shown in FIGS. 3, 5 and 6, the wiring sections 542 and 543 are arranged in the x direction. The wiring sections 542 and 543 are located on one side in the x direction (the x2 direction) with respect to the pad portion 541*b*, overlapping with the pad portion 541*b* as viewed in the x direction. The wiring sections 543 include one located on one side in the x direction (the x1 direction) with respect to the wiring section 542 and one on the other side in the x direction (the x2 direction) (see FIGS. 5 and 6). In the illustrated example, four wiring sections 543 are included, and two of the wiring sections 543 are located in the x1 direction from the wiring section 542 and the other two wiring sections 543 are located in the x2 direction from the wiring section 542. In other words, the semiconductor device A1 includes the same number of wiring sections 543 on either side of the wiring section 542. The locations of the wiring section 543 relative to the wiring section 542 in the x direction may be changed as necessary. For example, different numbers of wiring sections 543 may be provided on the x1-direction side and on the x2-direction side with respect to the wiring section 542. The wiring sections 542 and 543 are located on the side opposite the second semiconductor elements 2 in the y direction (i.e., located in the y2 direction) with respect to the first semiconductor elements 1. As shown in FIGS. 5 and 6, in the semiconductor device A1, the wiring sections 542 and 543 are located in the y2 direction from the wiring sections 522 and 523. In a different example, the wiring sections 542 and 543 may be located in the y1 direction from the wiring sections 522 and 523.

The wiring section 551 is formed on the obverse surface 411 of the insulating substrate 41. As shown in FIG. 5, the detection terminal 64 is electrically bonded to the wiring section 551. The wiring section 551 is an example of a “tenth wiring section”. As shown in FIGS. 5 and 6, the wiring section 551 includes two pad portions 551*a* and 551*b* and an interconnecting portion 551*c*. The pad portion 551*a* is where the detection terminal 64 is bonded. The pad portion 551*b* is where an end of the connecting member 751 is bonded. The pad portion 551*b* is located on one side in the x direction (in the x2 direction in the example shown in FIGS. 5 and 6) with respect to the pad portion 551*a*. The interconnecting portion 551*c* connects the two pad portions 551*a* and 551*b*.

The wiring section 552 is formed on the obverse surface 411 of the insulating substrate 41. As shown in FIGS. 5 and 6, the wiring section 552 has a strip shape elongated in the x direction in plan view. The wiring section 552 has the connecting members 751 and 752 bonded thereto. The wiring section 552 is electrically connected to the wiring section 551 with the connecting member 751. As shown in FIGS. 5 and 6, the wiring sections 532 and 552 are next to each other in the y direction and longitudinally parallel to each other. The wiring section 552 is an example of an “eleventh wiring section”.

The wiring sections 553 are formed on the obverse surface 411 of the insulating substrate 41. As shown in FIGS. 5 and 6, each wiring section 553 has a strip shape elongated in the x direction in plan view. Each wiring section 553 has a connecting member 752 and a connecting member 753 bonded thereto. Each wiring section 553 is electrically connected to the fifth electrode 22 (the source electrode) of a second semiconductor element 2 with a connecting member 753. The wiring section 553 is an example of a "twelfth wiring section".

As shown in FIGS. 3, 5 and 6, the wiring section 552 and the wiring sections 553 are aligned in the x direction. The wiring sections 552 and 553 are located on one side in the x direction (the x2 direction) with respect to the pad portion 551*b*, overlapping with the pad portion 551*b* as viewed in the x direction. The wiring sections 553 include one located on one side in the x direction (the x1 direction) with respect to the wiring section 552 and one on the other side in the x direction (the x2 direction) (see FIGS. 5 and 6). In the illustrated example, four wiring sections 553 are included, and two of the wiring sections 553 are located in the x1 direction from the wiring section 552 and the other two wiring sections 553 are located in the x2 direction from the wiring section 552. In other words, the semiconductor device A1 includes the same number of wiring sections 553 on either side the wiring section 552. The positions of the wiring section 553 with respect to the wiring section 552 in the x direction may be changed as necessary. For example, different numbers of wiring sections 553 may be provided on the x1-direction side and on the x2-direction side with respect to the wiring section 552. The wiring sections 552 and 553 are located on the side opposite the first semiconductor elements 1 in the y direction (i.e., located in the y1 direction) with respect to on the second semiconductor elements 2. As shown in FIGS. 5 and 6, in the semiconductor device A1, the wiring sections 552 and 553 are located in the y1 direction from the wiring sections 532 and 533. In a different example, the wiring section 552 and the wiring sections 553 may be located in the y2 direction from the wiring sections 532 and 533.

The wiring section 561 is formed on the obverse surface 411 of the insulating substrate 41. As shown in FIG. 5, the detection terminal 65 is electrically bonded to the wiring section 561. As shown in FIG. 6, the wiring section 561 includes a through-hole 561*a*. The through-hole 561*a* extends in the z direction through the wiring section 561. The through-hole 561*a* has the metal member 58 fitted therein.

The wiring sections 571 and 572 are formed on the obverse surface 411 of the insulating substrate 41. Each wiring section 571 is formed in a region of the obverse surface 411 between two first semiconductor elements 1 adjacent in the x direction in plan view. Each wiring section 572 is formed in a region of the obverse surface 411 between two second semiconductor elements 2 adjacent in the x direction in plan view. In the illustrated example, the wiring sections 571 and 572 are rectangular in plan view (see FIGS. 5 and 6) but not limited to such a shape. The wiring sections 571 may be integral with the wiring section 512, and the wiring sections 572 may be integral with the wiring section 513. The wiring sections 571 and 572 may be omitted. In the semiconductor device A1, the wiring sections 571 and 572 are not electrically connected to any of the first semiconductor elements 1 and the second semiconductor elements 2.

As shown in FIG. 11, each metal member 59 extends in the z direction through the insulating substrate 41, electrically connecting the wiring sections 513 and 514. The metal member 59 may be columnar, for example. In the illustrated example, the metal members 59 have a circular shape in plan view (see FIGS. 5 to 8). In different examples, the metal members 59 may have an oblong or elliptical shape or a polygonal shape in plan view. The metal members 59 may be made of copper or a copper alloy, for example.

As shown in FIGS. 6 to 8 and 11, each metal member 59 is fitted in a through-hole 513*a* of the wiring section 513 and a through-hole 514*b* of the wiring section 514 and inserted in a through-hole 413 of the insulating substrate 41. The metal member 59 is in contact with the inner surface of the through-hole 513*a* and the inner surface of the through-hole 514*b*. The metal member 59 is supported by the through-holes 513*a* and 514*b* by being fitted therein. When there is a clearance between the metal member 59 and the inner surface of the through-hole 513*a* and between the metal member 59 and the inner surface of the through-hole 514*b*, solder may be injected into the clearance. The injected solder will fill the clearance and bond the metal member 59 to the wiring sections 513 and 514. Note that the injected solder may also flow into the clearance between the metal member 59 and the inner surface of the through-hole 413 in the insulating substrate 41.

The metal member 58 extends in the z direction through the insulating substrate 41, electrically connecting the wiring sections 511 and 561. The metal member 58 may be columnar, for example. In the illustrated example, the metal member 58 has a circular shape in plan view (see FIGS. 6 to 8). In different examples, the metal member 58 may have an oblong or elliptical shape or a polygonal shape in plan view. The metal member 58 may be made of copper or a copper alloy, for example.

As shown in FIGS. 6 to 8, the metal member 58 is fitted in the through-hole 561*a* of the wiring section 561 and the through-hole 511*b* of the wiring section 511 and inserted in the through-hole 414 of the insulating substrate 41. The metal member 58 is in contact with the inner surfaces of the through-holes 561*a*, 511*b* and 414. The metal member 58 is supported by the through-holes 561*a*, 511*b* and 414 by being fitted therein. When there is a clearance between the metal member 58 and the inner surfaces of the through-holes 561*a*, 511*b* and 414, solder may be injected into the clearance. The injected solder will fill the clearance and bond the metal member 58 to the wiring sections 511 and 561 and the insulating substrate 41.

As shown in FIGS. 12 and 13, each first semiconductor element 1 of the semiconductor device A1 is accommodated in a recess defined by an opening 415 in the insulating substrate 41 and an opening 511*a* in the wiring section 511 and the conductive plate 31. In the illustrated example, the element obverse surface 1*a* of the first semiconductor element 1 overlaps with the insulating substrate 41 or the wiring section 511 as viewed in a direction perpendicular to the z direction (e.g., in the y direction). In another example, the element obverse surface 1*a* may overlap with the wiring section 512. In either example, the first semiconductor elements 1 do not protrude upward in the z direction (the z2 direction) beyond the wiring section 512. Similarly, as shown in FIGS. 12 and 14, each second semiconductor element 2 is accommodated in a recess defined by an opening 416 in the insulating substrate 41 and an opening 514*a* in the wiring section 514 and the conductive plate 32. In the illustrated example, the element obverse surface 2*a* of the second semiconductor element 2 overlaps with the insulating substrate 41 or the wiring section 514 as viewed in a direction perpendicular to the z direction (e.g., in the y direction). In another example, the element obverse surface 2*a* may overlap with the wiring section 513. In either example, the second semiconductor elements 2 do not protrude upward in the z direction (the z2 direction) beyond the wiring section 513.

The control terminals 61 and 62 and the detection terminals 63 to 65 are each made of an electrically conductive material. Examples of the conductive material include copper or a copper alloy. The control terminals 61 and 62 and the detection terminals 63 to 65 may be formed by cutting and bending a sheet material.

The control terminal 61 is electrically connected to the third electrodes 13 (the gate electrodes) of the first semiconductor elements 1. The control terminal 61 is used to input a first drive signal for controlling the switching operations of the first semiconductor elements 1. The control terminal 61 includes a portion covered with the sealing member 8 and a portion exposed from the sealing member 8. The covered portion of the control terminal 61 is bonded to the pad portion 521*a* of the wiring section 521. The exposed portion of the control terminal 61 is connected to an external control device (e.g., a gate driver) and used to input a first drive signal (gate voltage) from the control device. The control terminal 61 is an example of a "first control terminal".

The control terminal 62 is electrically connected to the sixth electrodes 23 (the gate electrodes) of the second semiconductor elements 2. The control terminal 62 is used to input a second drive signal for controlling the switching operations of the second semiconductor elements 2. The control terminal 62 includes a portion covered with the sealing member 8 and a portion exposed from the sealing member 8. The covered portion of the control terminal 62 is bonded to the pad portion 531*a* of the wiring section 531. The exposed portion of the control terminal 62 is connected to the external control device mentioned above and used to input a second drive signal (gate voltage) from the control device. The control terminal 62 is an example of a "second control terminal".

The detection terminal 63 is electrically connected to the second electrodes 12 (the source electrodes) of the first semiconductor elements 1. The detection terminal 63 outputs a first detection signal indicating the conducting state of each first semiconductor element 1. In the semiconductor device A1, the detection terminal 63 outputs, as the first detection signal, the voltage applied to the second electrode 12 of each first semiconductor element 1 (voltage corresponding to the source current). The detection terminal 63 includes a portion covered with the sealing member 8 and a portion exposed from the sealing member 8. The covered portion of the detection terminal 63 is bonded to the pad portion 541*a* of the wiring section 541. The exposed portion of the detection terminal 63 is connected to the external control device mentioned above and outputs the first detection signal to the external control device. The detection terminal 63 is an example of a "first detection terminal".

The detection terminal 64 is electrically connected to the fifth electrodes 22 (the source electrodes) of the second semiconductor elements 2. The detection terminal 64 outputs a second detection signal indicating the conducting state of each second semiconductor element 2. In the semiconductor device A1, the detection terminal 64 outputs, as the second detection signal, the voltage applied to the fifth electrode 22 of each second semiconductor element 2 (voltage corresponding to the source current). The detection terminal 64 includes a portion covered with the sealing member 8 and a portion exposed from the sealing member 8. The covered portion of the detection terminal 64 is bonded to the pad portion 551*a* of the wiring section 551. The exposed portion of the detection terminal 64 is connected to the external control device mentioned above and outputs the second detection signal to the external control device. The detection terminal 64 is an example of a "second detection terminal".

The detection terminal 65 is electrically connected to the first electrodes 11 (the drain electrodes) of the first semiconductor elements 1. The detection terminal 65 outputs a voltage applied to the first electrode 11 of each first semiconductor element 1 (voltage corresponding to the drain current). The detection terminal 65 includes a portion covered with the sealing member 8 and a portion exposed from the sealing member 8. The covered portion of the detection terminal 65 is bonded to the wiring section 561. The exposed portion of the detection terminal 65 is connected to the external control device mentioned above and outputs the voltage applied to the first electrode 11 of each first semiconductor element 1 (voltage corresponding to the drain current) to the external control device.

The connecting members 7 are used to electrically connect two separated parts. As described above, the plurality of connecting members 7 include the connecting members 711, 712, 721 to 723, 731 to 733, 741 to 743, 751 to 753. Each connecting member 7 may be a bonding wire, for example. One or more of the connecting members 7 (e.g., the connecting members 711 and 712) may be metal plates instead of bonding wires. Each connecting member 7 may be made of gold, aluminum or copper. The cross-sectional diameters of the connecting members 711, 712, 721 to 723, 731 to 733, 741 to 743 and 751 to 753 are not specifically limited. Preferably, the cross-sectional diameters of the connecting member 711 and 712 are greater than the cross-sectional diameters of the connecting members 721 to 723, 731 to 733, 741 to 743 and 751 to 753. This is because the principal current flows through the connecting members 711 and 712.

As shown in FIGS. 3 and 5, each connecting member 711 is bonded to the second electrode 12 (the source electrode) of a first semiconductor element 1 and the wiring section 513 to provide electrical connection between them. Unlike the illustrated example, each connecting member 711 may be bonded to the upper surface of a metal member 59 rather than to the wiring section 513. As shown in FIGS. 4 and 5, each connecting member 712 is bonded to the fifth electrode 22 (the source electrode) of a second semiconductor element 2 and the wiring section 512 to provide electrical connection between them.

As shown in FIGS. 3, 5 and 9, the connecting member 721 is bonded to the pad portion 521*b* of the wiring section 521 and the wiring section 522 to electrically connect the wiring sections 521 and 522. As shown in FIG. 5, the connecting member 721 extends in the x direction in plan view. In addition, the connecting member 721 crosses each wiring section 523 located in the x1 direction from the wiring section 522 in plan view. In the illustrated example, the connecting member 721 overlaps with the connecting members 722 bonded to the relevant wiring sections 523 in plan view (see FIG. 5). In a different example, the connecting member 721 may be placed without such overlap. The connecting member 721 is elevated to pass above the relevant wiring sections 523 and the relevant connecting members 722 in the z direction. The connecting member 721 is an example of a "first connecting member".

As shown in FIGS. 3, 5 and 9, each connecting member 722 is bonded to the wiring section 522 and a wiring section 523 to electrically connect the wiring sections 522 and 523. As shown in FIG. 5, the connecting members 722 extend in the x direction in plan view. Each connecting member 722 is an example of a "second connecting member".

As shown in FIGS. 3 and 5, each connecting member 723 is bonded to a wiring section 523 and the third electrode 13 (the gate electrode) of a first semiconductor element 1 to electrically connect the wiring section 523 and the third electrode 13 of the first semiconductor element 1. Each connecting member 723 is an example of a "third connecting member".

As shown in FIGS. 4, 5 and 10, the connecting member 731 is bonded to the pad portion 531*b* of the wiring section 531 and the wiring section 532 to electrically connect the wiring sections 531 and 532. As shown in FIG. 5, the connecting member 731 extends in the x direction in plan view. In addition, the connecting member 731 crosses each wiring section 533 located in the x1 direction from the wiring section 532 in plan view. In the illustrated example, the connecting member 731 overlaps with the connecting members 732 bonded to the relevant wiring sections 523 in plan view (see FIG. 5). In a different example, the connecting member 732 may be placed without such overlap. As shown in FIG. 10, the connecting member 731 is elevated to pass above the relevant wiring sections 533 and the relevant connecting members 732 in the z direction. The connecting member 731 is an example of a "seventh connecting member".

As shown in FIGS. 4 and 5, each connecting member 732 is bonded to the wiring section 532 and a wiring section 533 to electrically connect the wiring sections 532 and 533. As shown in FIG. 5, the connecting members 732 extend in the x direction in plan view. Each connecting member 732 is an example of an "eighth connecting member".

As shown in FIGS. 4 and 5, each connecting member 733 is bonded to a wiring section 533 and the sixth electrode 23 (the gate electrode) of a second semiconductor element 2 to electrically connect the wiring section 533 and the sixth electrode 23 of the second semiconductor element 2. Each connecting member 733 is an example of a "ninth connecting member".

As shown in FIGS. 3 and 5, the connecting member 741 is bonded to the pad portion 541*b* of the wiring section 541 and the wiring section 542 to electrically connect the wiring sections 541 and 542. As shown in FIG. 5, the connecting member 741 extends in the x direction in plan view. In addition, the connecting member 741 crosses each wiring section 543 located in the x1 direction from the wiring section 542 in plan view. In the illustrated example, the connecting member 741 overlaps with the connecting members 742 bonded to the relevant wiring sections 543 in plan view (see FIG. 5). In a different example, the connecting member 741 may be placed without such overlap. The connecting member 741 is elevated to pass above the relevant wiring sections 543 and the relevant connecting members 742 in the z direction. The connecting member 741 is an example of a "fourth connecting member".

As shown in FIGS. 3 and 5, each connecting member 742 is bonded to the wiring section 542 and a wiring section 543 to electrically connect the wiring sections 542 and 543. As shown in FIG. 5, the connecting members 742 extend in the x direction in plan view. Each connecting member 742 is an example of a "fifth connecting member".

As shown in FIGS. 3 and 5, each connecting member 743 is bonded to a wiring section 543 and the second electrode 12 (the source electrode) of a first semiconductor element 1 to electrically connect the wiring section 543 and the second electrode 12 of the first semiconductor element 1. Each connecting member 743 is an example of a "sixth connecting member".

As shown in FIGS. 4 and 5, the connecting member 751 is bonded to the pad portion 551*b* of the wiring section 551 and the wiring section 552 to electrically connect the wiring sections 551 and 552. As shown in FIG. 5, the connecting member 751 extends in the x direction in plan view. In addition, the connecting member 751 crosses each wiring section 553 located in the x1 direction from the wiring section 552 in plan view. In the illustrated example, the connecting member 751 overlaps with the connecting members 752 bonded to the relevant wiring sections 553 in plan view (see FIG. 5). In a different example, the connecting member 751 may be placed without the overlap. The connecting member 751 is elevated to pass above the relevant wiring sections 553 and the relevant connecting members 752 in the z direction. The connecting member 731 is an example of a "tenth connecting member".

As shown in FIGS. 4 and 5, each connecting member 752 is bonded to the wiring section 552 and a wiring section 553 to electrically connect the wiring sections 552 and 553. As shown in FIG. 5, the connecting members 752 extend in the x direction in plan view. Each connecting member 752 is an example of an "eleventh connecting member".

As shown in FIGS. 4 and 5, each connecting member 753 is bonded to a wiring section 553 and the fifth electrode 22 (the source electrode) of a second semiconductor element 2 to electrically connect the wiring section 553 and the fifth electrode 22 of the second semiconductor element 2. Each connecting member 753 is an example of a "twelfth connecting member".

The sealing member 8 covers the first semiconductor elements 1, the second semiconductor elements 2, a portion of the supporting member 3, the insulating substrates 41, a portion each of the wiring sections 511 to 514, the wiring sections 521 to 523, 531 to 533, 541 to 543, 551 to 553, 561, 571 and 572, a portion of each of the control terminals 61 and 62, a portion of each of the detection terminals 63 to 65 and the connecting members 7. The sealing member 8 may be made of an insulating resin, such as epoxy resin, for example. As shown in FIG. 5, the sealing member 8 is rectangular in plan view.

As shown in FIGS. 1, 5 and 9 to 12, the sealing member 8 has a resin obverse surface 81, a resin reverse surface 82 and a plurality of resin side surfaces 831 to 834. As shown in FIGS. 9 to 12, the resin obverse surface 81 and the resin reverse surface 82 are spaced apart in the z direction. The resin obverse surface 81 faces in the z2 direction, and the resin reverse surface 82 faces in the z1 direction. As shown in FIGS. 5, 9 and the resin side surfaces 831 and 832 are spaced apart in the x direction. The resin side surface 831 faces in the x1 direction, and the resin side surface 832 faces in the x2 direction. The control terminals 61 and 62 and the detection terminals 63 to 65 protrude from the resin side surface 831. As shown in FIGS. 5, 11 and 12, the resin side surfaces 833 and 834 are spaced apart in the y direction. The resin side surface 833 faces in the y1 direction, and the resin side surface 834 faces in the y2 direction.

The sealing member 8 has cut-away portions where portions of the resin obverse surface 81 and the resin reverse surface 82 are removed along the resin side surface 832. As shown in FIGS. 1, 9 and 10, the cut-away portions expose the first power-terminal portion 501, the second power-terminal portion 502, the third power-terminal portion 503 and the fourth power-terminal portion 504 from the sealing member 8.

The semiconductor device A1 has following advantages.

The semiconductor device A1 is provided with the wiring sections 522 and 523 added to the conduction paths between the wiring section 521, to which the control terminal 61 is electrically connected, and the third electrodes 13 of the first semiconductor elements 1. The wiring section 522 and 523 are separated from the wiring section 521. In a semiconductor device different from the semiconductor device A1, the wiring sections 521, 522 and 523 may be integrally formed. In such a device, the wiring sections 521 522 and 523 are formed as one strip-shaped wiring section, and the connecting members 723 are connected to this trip-shaped wiring section rather than to the plurality of wiring sections 523. With this configuration, the conduction path from each third electrode 13 to the control terminal 61 may be unduly short. Then, without a resistor (e.g., gate resistance) connected to the third electrode 13, unexpected oscillation may occur in the first drive signal (e.g., the gate voltage). For the semiconductor device A1, in contrast, the wiring sections 522 and 523 are separated from the wiring section 521, and the connecting members 721, 722 and 723 are used to electrically connect the wiring section 521 and the third electrodes 13 (the gate electrodes) of the first semiconductor elements 1. With this configuration, a longer conduction path can be formed from each third electrode 13 to the control terminal 61 as compared with the configuration in which the wiring sections 521, 522 and 523 are formed as one strip-shaped wiring section. It is therefore possible to increase the inductance of the transmission path of the first drive signal from the control terminal 61 to each first semiconductor element 1 by increasing the length of the transmission path. Consequently, the semiconductor device A1 can prevent oscillation of the first drive signal without a resistor (e.g., gate resistance) connected to the third electrode 13.

The semiconductor device A1 includes the first semiconductor elements 1 arranged side by side in the x direction. In addition, the control terminal 61 is located on one side in the x direction (the x1 direction in the example illustrated in FIG. 5) with respect to the first semiconductor elements 1. With this configuration, unless the wiring sections 521, 522 and 523 are separated, the conduction path from the third electrode 13 to the control terminal 61 tends to shorter for the first semiconductor element 1 nearest to the control terminal 61 (the outermost first semiconductor element 1 in x1 direction in FIG. 5). In other words, depending on the locations of the first semiconductor elements 1 and the control terminal 61, some of the first semiconductor elements 1 may be more likely to cause oscillation of the first drive signal than others. Providing the wiring sections 522 and 523 that are separated from the wiring section 521 is therefore effective for preventing oscillation of the first drive signal inputted to the first semiconductor element 1 nearest to the control terminal 61.

The semiconductor device A1 includes one wiring section 523 for each first semiconductor element 1. All of the wiring sections 523 are electrically connected to the wiring section 522. With this configuration, each conduction path between the third electrodes 13 of the first semiconductor elements 1 is formed via the wiring section 522 and the two wiring sections 523, thereby increasing the length of the conduction path as compared with a conduction path formed via one wiring section (the strip-shaped wiring section mentioned above). This can prevent parasitic oscillation caused by a loop formed between the first electrode 11 and the third electrode 13 of each first semiconductor element 1 when the first semiconductor elements 1 are connected in parallel. In short, the semiconductor device A1 is configured to prevent parasitic oscillation that can occur when the first semiconductor elements 1 are connected in parallel. Another solution to prevent or reduce parasitic oscillation that can occur in the paralleled first semiconductor elements 1 is to equalize the conduction paths from the first power-terminal portion 501 to the first electrodes 11 of the first semiconductor elements 1. Yet, the solution of the present disclosure of increasing the lengths of the conduction paths between the third electrodes 13 is more preferable for preventing parasitic oscillation when there is a restriction on the relative positions of the first semiconductor elements 1 and the first power-terminal portion 501 or when the parasitic oscillation frequency is high (e.g., several hundreds of MHz).

The semiconductor device A1 is provided with the plurality of wiring sections 523 including one located on one side in the x direction with respect to the wiring section 522 and one located on the other side in the x direction with respect to the wiring section 522. This configuration can reduce the difference in length among the conduction paths from the control terminal 61 to the third electrodes 13. Specifically, the semiconductor device A1 includes an even number of wiring section 523, and the same number of wiring sections 523 are provided on either side of the wiring section 522. This layout can reduce the difference in length among the conduction paths from the control terminal 61 to the third electrodes 13, which is preferable for equalizing the conduction paths.

The semiconductor device A1 includes the connecting members 721, 722 and 723, each of which may be a bonding wire, for example. The parasitic inductance from the control terminal 61 to the third electrode 13 of each first semiconductor element 1 can be adjusted by adjusting the parasitic inductances of the connecting members 721, 722 and 723. The parasitic inductances of the connecting members 721, 722 and 723 can be adjusted by adjusting the respective lengths of the connecting members 721, 722 and 723. Adjusting the length of a bonding wire is easier than adjusting the length of a connecting member made of a metal plate. That is, for the semiconductor device A1, it is easy to finely adjust the respective parasitic inductances from the control terminal 61 to the third electrodes 13, depending on the characteristic variations among the first semiconductor elements 1.

The semiconductor device A1 is provided with one wiring section 543 for each first semiconductor element 1. All of the wiring sections 543 are electrically connected to the wiring section 542. With this configuration, each conduction path between the second electrodes 12 of the first semiconductor elements 1 is formed via the wiring section 542 and the two wiring sections 543, thereby increasing the length of the conduction path as compared with a conduction path formed via one wiring section (the wiring sections 541 to 543 that are integrally formed). Parasitic oscillation in the first semiconductor elements 1 connected in parallel can be caused not only by a loop formed between the first electrode 11 and the third electrode 13 of each first semiconductor element 1 but also by a loop formed between the second electrode 12 and the third electrode 13 of each first semiconductor element 1. Increasing the length of each conduction path between the second electrodes 12 can therefore serve to prevent parasitic oscillation that can occur when the first semiconductor elements 1 are connected in parallel.

The semiconductor device A1 is provided with the wiring sections 532 and 533 added to the conduction paths between the wiring section 531, to which the control terminal 62 is electrically connected, and the sixth electrodes 23 of the second semiconductor elements 2. The wiring section 532 and 533 are separated from the wiring section 531. With this configuration, a longer conduction path can be formed from each sixth electrode 23 to the control terminal 62, as with the conduction path from each third electrode 13 to the control terminal 61. It is therefore possible to increase the inductance of the transmission path of the second drive signal from the control terminal 62 to each second semiconductor element 2 by increasing the length of the transmission path. Consequently, the semiconductor device A1 can prevent oscillation of the second drive signal without a resistor (e.g., gate resistance) connected to the sixth electrode 23.

The semiconductor device A1 includes the second semiconductor elements 2 arranged side by side in the x direction. In addition, the control terminal 62 is located on one side in the x direction (the x1 direction in the example illustrated in FIG. 5) with respect to the second semiconductor elements 2. With this configuration, unless the wiring sections 531, 532 and 533 are separated, the conduction path from the sixth electrode 23 to the control terminal 62 tends to be shorter for the second semiconductor element 2 nearest to the control terminal 62 (the outermost second semiconductor element 2 in x1 direction in FIG. 5). In other words, depending on the locations of the second semiconductor elements 2 and the control terminal 62, the second semiconductor elements 2 may be more likely to cause oscillation of the second drive signal. Providing the wiring sections 532 and 533 that are separated from the wiring section 531 is therefore effective for preventing oscillation of the second drive signal inputted to the second semiconductor element 2 nearest to the control terminal 62.

The semiconductor device A1 is provided with one wiring section 533 for each second semiconductor element 2. All of the wiring sections 533 are electrically connected to the wiring section 532. With this configuration, each conduction path between the sixth electrodes 23 of the second semiconductor elements 2 is formed via the wiring section 532 and the two wiring sections 533, thereby increasing the length of the conduction path as compared with a conduction path formed via one wiring section (the wiring sections 531 to 533 that are integrally formed). This can prevent parasitic oscillation caused by a loop formed between the fourth electrode 21 and the sixth electrode 23 of each second semiconductor element 2 when the second semiconductor element 2 are connected in parallel. In short, the semiconductor device A1 is configured to prevent parasitic oscillation that can occur when the second semiconductor elements 2 are connected in parallel.

The semiconductor device A1 is provided with the plurality of wiring sections 533 including one located on one side in the x direction with respect to the wiring section 532 and one located on the other side in the x direction with respect to the wiring section 532. This layout can reduce the difference in length among the conduction paths from the control terminal 62 to the sixth electrodes 23. Specifically, the semiconductor device A1 includes an even number of wiring section 533, and the same number of wiring sections 533 are provided on either side of the wiring section 532. This layout can reduce the difference in length among the conduction paths from the control terminal 62 to the sixth electrodes 23, which is preferable for equalizing the conduction paths.

The semiconductor device A1 includes the connecting members 731, 732 and 733, each of which may be a bonding wire, for example. The parasitic inductance from the control terminal 62 to the sixth electrode 23 of each second semiconductor element 2 can be adjusted by adjusting the parasitic inductances of the connecting members 731, 732 and 733. The parasitic inductances of the connecting members 731, 732 and 733 can be adjusted by adjusting the respective lengths of the connecting members 731, 732 and 733. Adjusting the length of a bonding wire is easier than adjusting the length of a connecting member made of a metal plate. That is, for the semiconductor device A1, it is easy to finely adjust the respective parasitic inductances from the control terminal 62 to the sixth electrodes 23, depending on the characteristic variations among the second semiconductor elements 2.

The semiconductor device A1 is provided with one wiring section 553 for each second semiconductor element 2. All of the wiring sections 553 are electrically connected to the wiring section 552. With this configuration, a longer conduction path can be formed between the fifth electrodes 22 as with each conduction path between the second electrodes 12. Parasitic oscillation in the second semiconductor elements 2 connected in parallel can be caused not only by a loop formed between the fourth electrode 21 and the sixth electrode 23 of each second semiconductor element 2 but also by a loop formed between the fifth electrode 22 and the sixth electrode 23 of each second semiconductor element 2. Increasing the length of each conduction path between the fifth electrodes 22 can therefore serve to prevent parasitic oscillation that can occur when the second semiconductor elements 2 are connected in parallel.

Figure 15:
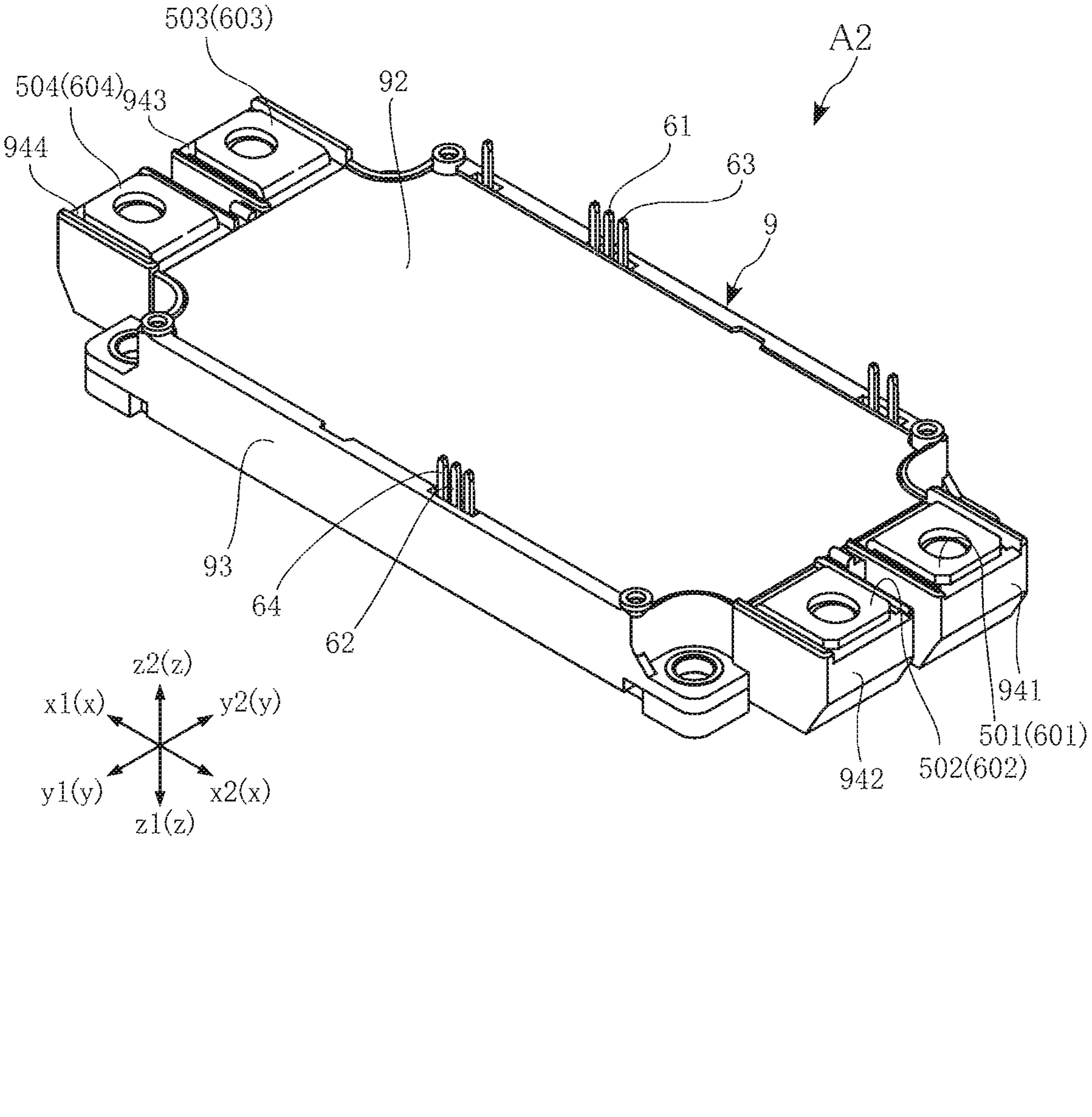
FIG. 15 is a perspective view of a semiconductor device according to a second embodiment.
Figure 16:
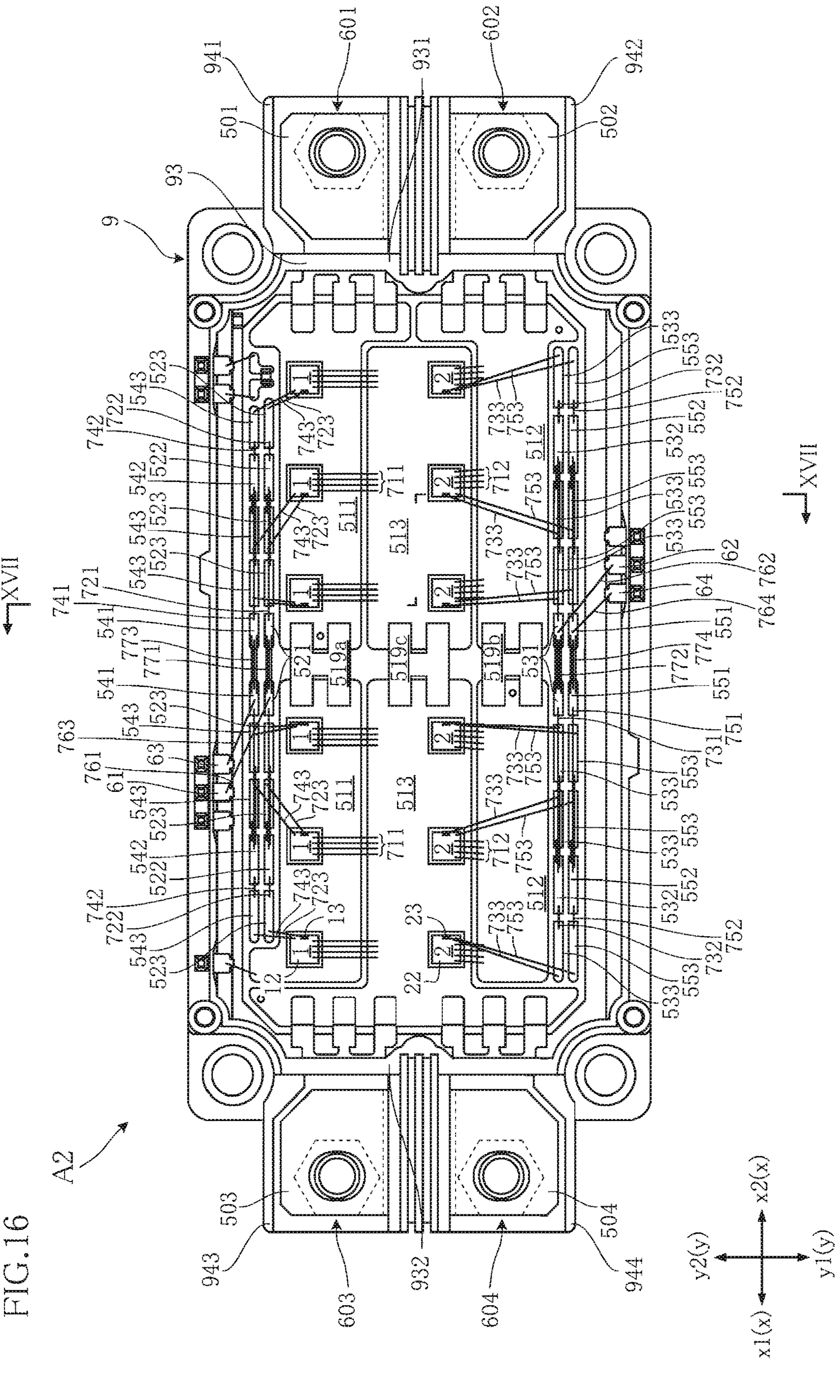
FIG. 16 is a plan view of the semiconductor device according to the second embodiment with a portion of a case omitted.
Figure 17:
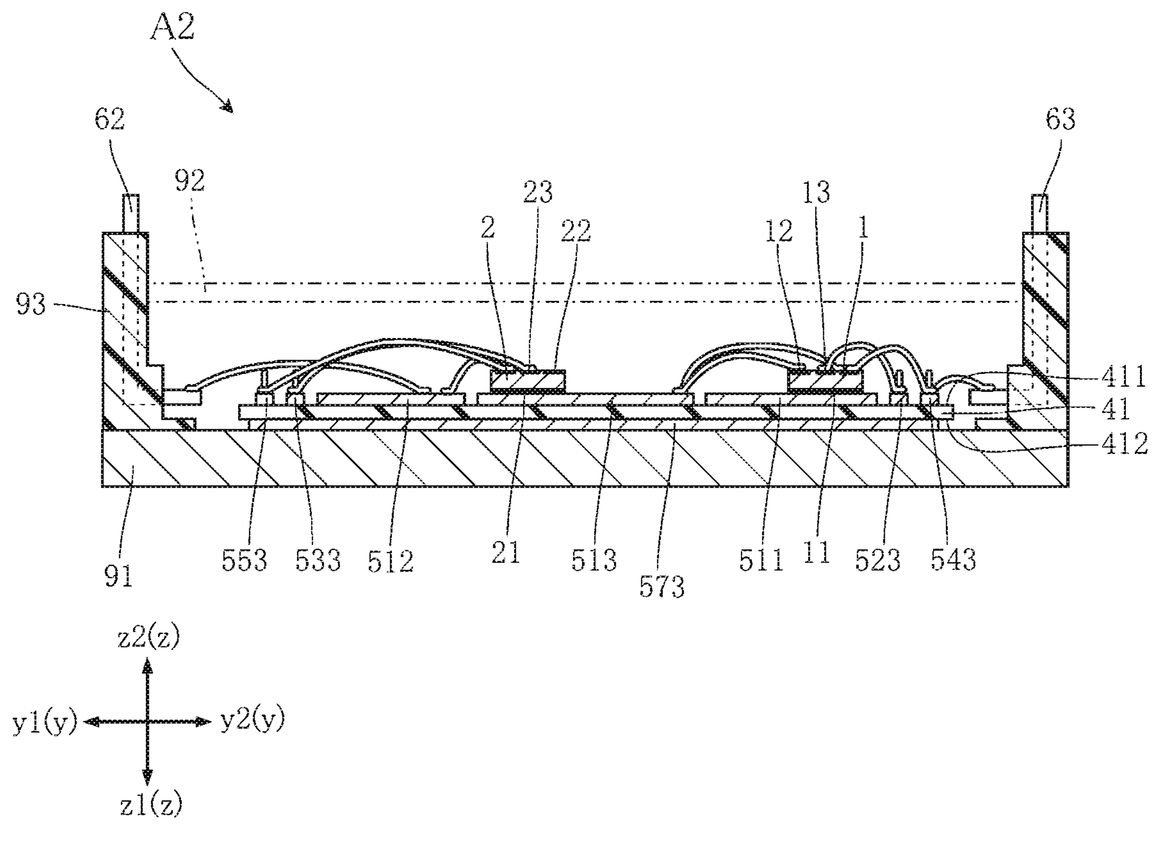
FIG. 17 is a sectional view taken along line XVII-XVII of FIG. 16 with the case shown in phantom.

FIGS. 15 to 17 show a semiconductor device A2 according to a second embodiment. FIG. 15 is a perspective view of the semiconductor device A2. FIG. 16 is a plan view of the semiconductor device A2 with a portion (a top plate 92) of a later-described case 9 omitted. FIG. 17 is a sectional view taken along line XVII-XVII of FIG. 16, with the top plate 92 of the case 9 shown in phantom (two-dot-dash lines).

For the semiconductor device A1, the first semiconductor elements 1 are mounted on the conductive plate 31, and the second semiconductor elements 2 are mounted on the conductive plate 32. For the semiconductor device A2, the first semiconductor elements 1 are bonded to the wiring section 511, and the second semiconductor elements 2 are bonded to the wiring section 513. For the semiconductor device A1, in addition, the first power-terminal portion 501 and the second power-terminal portion 502 overlap in plan view, and the third power-terminal portion 503 and the fourth power-terminal portion 504 overlap in plan view. For the semiconductor device A2, the first power-terminal portion 501 and the second power-terminal portion 502 are disposed adjacent to each other in plan view, and the third power-terminal portion 503 and the fourth power-terminal portion 504 are disposed adjacent to each other in plan view.

As shown in FIGS. 15 to 17, the semiconductor device A2 is provided with the case 9 instead of the sealing member 8. The case 9 substantially has the shape of a rectangular parallelepiped and encloses the first semiconductor elements 1, the second semiconductor elements 2, the insulating substrate 41, the wiring sections 511 to 513, 521 to 523, 531 to 533, 541 to 543 and 551 to 553 and the connecting members 7 and so on. The case 9 is made of a synthetic resin that is electrically insulating and highly heat-resistant, such as polyphenylene sulfide (PPS).

The case 9 includes a heat dissipation plate 91 as a bottom plate, a frame 93 fixed to the surface of the heat dissipation plate 91 on the side in the z2 direction, and the top plate 92 fixed to the frame 93. The top plate 92 closes the frame 93 on the side in the z2 direction and faces toward the heat dissipation plate 91 that closes the frame 93 on the side in the z1 direction. The top plate 92, the heat dissipation plate 91 and the frame 93 together define an internal space of the case 9 for accommodating the components described above.

As shown in FIGS. 15 and 16, the case 9 is provided with terminal supports 941 to 944. The terminal supports 941 to 944 are integral with the frame 93. The terminal supports 941 and 942 are connected to the side wall 931 (see FIG. 16) of the frame 93 on the side in the x2 direction. The terminal supports 941 and 942 are arranged side by side in the y direction. The terminal support 941 is located in the y2 direction from the terminal support 942. The terminal supports 943 and 944 are connected to the side wall 932 (see FIG. 16) of the frame 93 on the side in the x1 direction. The terminal supports 943 and 944 are arranged side by side in the y direction. The terminal support 943 is located in the y2 direction from the terminal support 944.

As shown in FIGS. 16 and 17, the semiconductor device A2 includes the wiring sections 511 to 513, 521 to 523, 531 to 533, 541 to 543, 551 to 553 and 573. As can be seen from FIGS. 16 and 17, the wiring section 511 to 513, 521 to 523, 531 to 533, 541 to 543 and 551 to 553 are formed on the obverse surface 411 of the insulating substrate 41. As shown in FIG. 17, the wiring section 573 is formed on the reverse surface 412 of the insulating substrate 41.

The two wiring sections 511 are arranged side by side in the x direction and spaced apart from each other. The two wiring sections 511 are electrically connected to each other by a coupling member 519*a*. The coupling member 519*a* is a conductive plate, which may be made of copper or a copper alloy, for example. In another example, the coupling member 519*a* is not limited to copper or a copper alloy. The first semiconductor elements 1 are bonded to the two wiring sections 511, such that the two wiring sections 511 are electrically connected to the first electrodes 11 (the drain electrodes) of the first semiconductor elements 1.

The two wiring sections 512 are arranged side by side in the x direction and spaced apart from each other. The two wiring sections 512 are electrically connected to each other by a coupling member 519*b*. The coupling member 519*b* is a conductive plate, which may be made of copper or a copper alloy, for example. In another example, the coupling member 519*b* is not limited to copper or a copper alloy. The two wiring sections 512 are electrically connected to the fifth electrode 22 (the source electrode) of each second semiconductor element 2 via a plurality of connecting members 712.

The two wiring sections 513 are arranged side by side in the x direction and spaced apart from each other. The two wiring sections 513 are electrically connected to each other by a coupling member 519*c*. The coupling member 519*c* is a conductive plate, which may be made of copper or a copper alloy, for example. In another example, the coupling member 519*c* is not limited to copper or a copper alloy. The two wiring sections 513 are electrically connected to the second electrode 12 (the source electrode) of each first semiconductor element 1 via a plurality of connecting members 711. The second semiconductor elements 2 are bonded to the two wiring sections 513, such that the two wiring sections 513 are electrically connected to the fourth electrodes 21 (the drain electrodes) of the second semiconductor elements 2.

As shown in FIG. 16, the semiconductor device A2 includes two wiring sections 521, two wiring sections 531, two wiring sections 541 and two wiring section 551. The two wiring sections 521 are adjacent to each other in the x direction with a suitable space therebetween. The two wiring sections 521 are electrically connected to each other by a connecting member 771. The two wiring sections 531 are adjacent to each other in the x direction with a suitable space therebetween. The two wiring sections 531 are electrically connected to each other by a connecting member 772. The two wiring sections 541 are adjacent to each other in the x direction with a suitable space therebetween. The two wiring sections 541 are electrically connected to each other by a connecting member 773. The two wiring sections 551 are adjacent to each other in the x direction with a suitable space therebetween. The two wiring sections 551 are electrically connected to each other by a connecting member 774. Each of the connecting members 771 to 774 may be a bonding wire, for example. Each of the connecting members 771 to 774 may be made of gold, copper, aluminum, or an alloy containing any of these metals.

As shown in FIG. 16, each of the two wiring section 521 is arranged side by side with one wiring section 522 and a plurality of wiring sections 523 in the x direction. In the illustrated example, the semiconductor device A2 includes two sets of wiring sections, each set including one wiring section 521, one wiring section 522 and three wiring sections 523. The two sets of wiring sections are located next to each other in the x direction with the two wiring sections 521 in the middle. The wiring sections 521, 522 and 523 in each set are electrically connected as necessary by the connecting members 721 and 722 as in the semiconductor device A1. Each wiring section 523 is electrically connected to the third electrode 13 (the gate electrode) of a first semiconductor element 1 by a connecting member 723 as in the semiconductor device A1.

As shown in FIG. 16, each of the two wiring section 531 is arranged side by side with one wiring section 532 and a plurality of wiring sections 533 in the x direction. In the illustrated example, the semiconductor device A2 includes two sets of wiring sections, each set including one wiring section 531, one wiring section 532 and three wiring sections 533. The two sets of wiring sections are located next to each other in the x direction with the two wiring sections 531 in the middle. The wiring sections 531, 532 and 533 in each set are electrically connected as necessary by the connecting members 731 and 732 as in the semiconductor device A1. Each wiring section 533 is electrically connected to the sixth electrode 23 (the gate electrode) of a second semiconductor element 2 by a connecting member 733 as in the semiconductor device A2.

As shown in FIG. 16, each of the two wiring section 541 is arranged side by side with one wiring section 542 and a plurality of wiring sections 543 in the x direction. In the illustrated example, the semiconductor device A2 includes two sets of wiring sections, each set including one wiring section 541, one wiring section 542 and three wiring sections 543. The two sets of wiring sections are located next to each other in the x direction with the two wiring sections 541 in the middle. The wiring sections 541, 542 and 543 in each set are electrically connected as necessary by the connecting members 741 and 742 as in the semiconductor device A1. Each wiring section 543 is electrically connected to the second electrode 12 (the source electrode) of a first semiconductor element 1 by a connecting member 743 as in the semiconductor device A2.

As shown in FIG. 16, each of the two wiring section 551 is arranged side by side with one wiring section 552 and a plurality of wiring sections 553 in the x direction. In the illustrated example, the semiconductor device A2 includes two sets of wiring sections, each set including one wiring section 551, one wiring section 552 and three wiring sections 553. The two sets of wiring sections are located next to each other in the x direction with the two wiring sections 551 in the middle. The wiring sections 551, 552 and 553 in each set are electrically connected as necessary by the connecting members 751 and 752 as in the semiconductor device A1. Each wiring section 553 is electrically connected to the fifth electrode 22 (the source electrode) of a second semiconductor element 2 by a connecting member 753 as in the semiconductor device A1.

The wiring section 573 is formed on substantially the entire reverse surface 412 of the insulating substrate 41. In another example, the region to be covered by the wiring section 543 is not specifically limited. The wiring section 573 may be made of copper or a copper alloy. The wiring section 573 is bonded to the heat dissipation plate 91.

As shown in FIGS. 15 and 16, the semiconductor device A2 includes a first power terminal 601, a second power terminal 602, a third power terminal 603 and a fourth power terminal 604.

The first power terminal 601 is bonded to a wiring section 511 within the case 9. The first power terminal 601 is thus electrically connected to the first electrodes 11 (the drain electrodes) of the first semiconductor elements 1. The first power terminal 601 includes the first power-terminal portion 501. As shown in FIGS. 15 and 16, the first power-terminal portion 501 is located on the upper surface (the surface in the z2 direction) of the terminal support 941.

The second power terminal 602 is bonded to a wiring section 512 within the case 9. The second power terminal 602 is thus electrically connected to the fifth electrodes 22 (the source electrodes) of the second semiconductor elements 2. The second power terminal 602 includes the second power-terminal portion 502. As shown in FIGS. 15 and 16, the second power-terminal portion 502 is located on the upper surface (the surface in the z2 direction) of the terminal support 942.

The third power terminal 603 and the fourth power terminal 604 are bonded to a wiring section 513 within the case 9. The third power terminal 603 and the fourth power terminal 604 are thus electrically connected to the second electrodes 12 (the source electrodes) of the first semiconductor elements 1 and the fourth electrodes 21 (the drain electrodes) of the second semiconductor elements 2. The third power terminal 603 includes the third power-terminal portion 503. As shown in FIGS. 15 and 16, the third power-terminal portion 503 is located on the upper surface (the surface in the z2 direction) of the terminal support 943. The fourth power terminal 604 includes the fourth power-terminal portion 504. As shown in FIGS. 15 and 16, the fourth power-terminal portion 504 is located on the upper surface (the surface in the z2 direction) of the terminal support 944.

In the semiconductor device A2, the control terminal 61 is not bonded to either of the two wiring sections 521 and is electrically connected within the case 9 to one of the two wiring sections 521 with a connecting member 761. The control terminal 62 is not bonded to either of the two wiring sections 531 and is electrically connected within the case 9 to one of the two wiring sections 531 with a connecting member 762. The detection terminal 63 is not bonded to either of the two wiring sections 541 and is electrically connected within the case 9 to one of the two wiring sections 541 with a connecting member 763. The detection terminal 64 is not bonded to either of the two wiring sections 551 and is electrically connected within the case 9 to one of the two wiring sections 551 with a connecting member 764. Each of the connecting members 761 to 764 may be a bonding wire, for example. Each of the connecting members 761 to 764 may be made of gold, copper, aluminum, or an alloy containing any of these metals.

As shown in FIGS. 16 and 17, the semiconductor device A2 is provided with the wiring sections 522 and 523 added to the conduction paths between the wiring section 521, to which the control terminal 61 is electrically connected, and the third electrodes 13 of the first semiconductor elements 1. The wiring section 522 and 523 are separated from the wiring section 521. Similarly to the semiconductor device A1, the semiconductor device A2 makes it possible to increase the inductance of the transmission path of the first drive signal from the control terminal 61 to each first semiconductor element 1 by increasing the length of the transmission path. Consequently, the semiconductor device A2 can prevent oscillation of the first drive signal without a resistor (e.g., gate resistance) connected to the third electrode 13. The semiconductor device A2 also achieves other advantages of the semiconductor device A1 through the same configuration as that of the semiconductor device A1.

Figure 18:
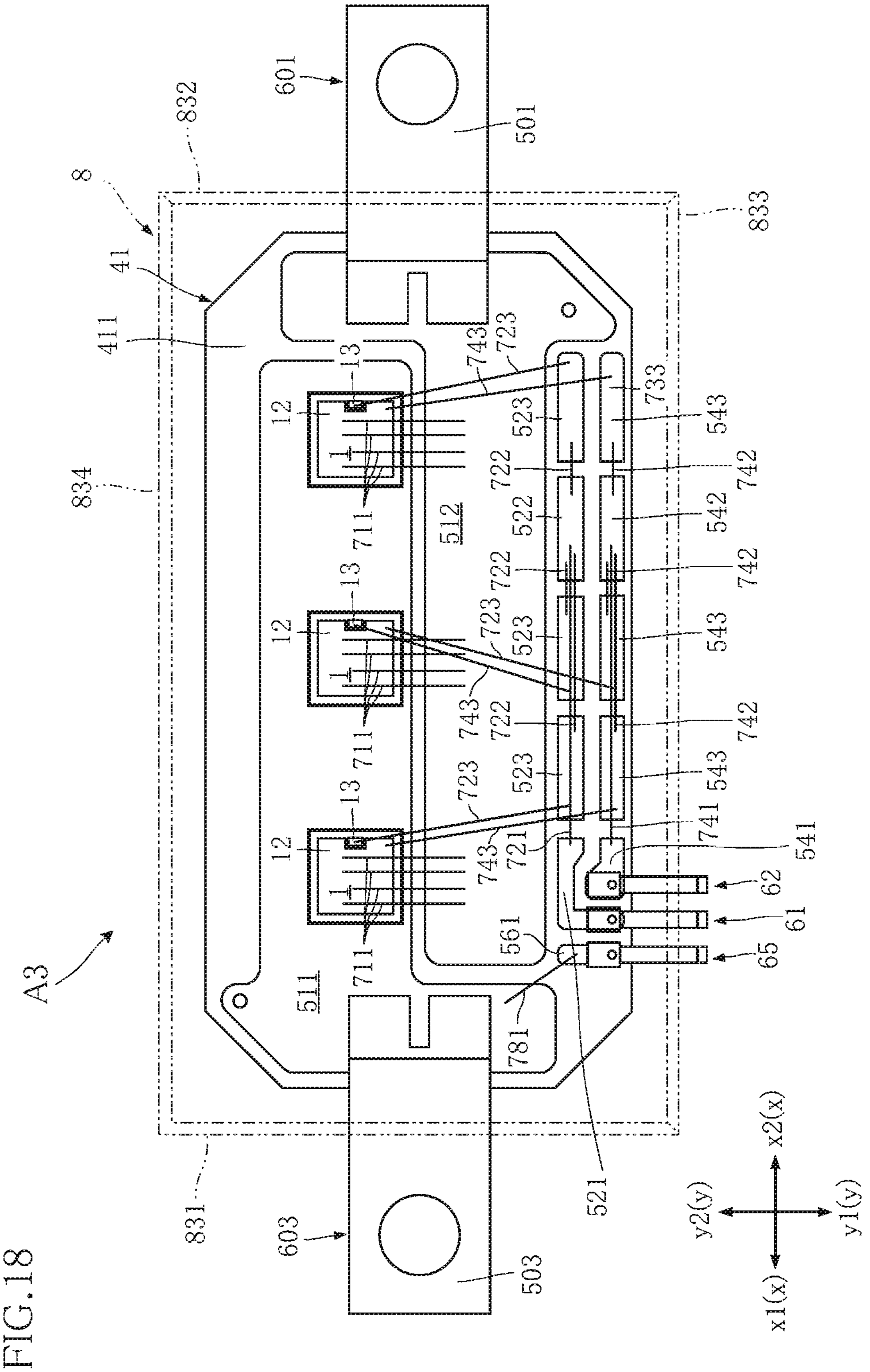
FIG. 18 is a plan view of a semiconductor device according to a third embodiment with a sealing member shown in phantom.

FIG. 18 shows a semiconductor device A3 according to a third embodiment. FIG. 18 is a plan view of the semiconductor device A3, with the sealing member 8 shown in phantom (two-dot-dash lines).

The semiconductor devices A1 and A2 each include the plurality of first semiconductor elements 1 and the plurality of second semiconductor elements 2. In contrast, the semiconductor device A3 includes the plurality of first semiconductor elements 1 but does not include any second semiconductor element 2.

As shown in FIG. 18, the first semiconductor elements 1 are bonded to the wiring section 511 as in the semiconductor device A2. The semiconductor device A3, which does not include any second semiconductor element, includes fewer wiring sections than the semiconductor device A2. The wiring section 561 of the semiconductor device A3 is electrically connected to the wiring section 511 via a connecting member 781 and thus to the first electrodes 11 (the drain electrodes) of the first semiconductor elements 1. The connecting members 781 may be a bonding wire, for example.

Similarly to the semiconductor devices A1 and A2 and as shown in FIG. 18, the semiconductor device A3 is provided with the wiring sections 522 and 523 added to the conduction paths between the wiring section 521, to which the control terminal 61 is electrically connected, and the third electrodes 13 of the first semiconductor elements 1. The wiring section 522 and 523 are separated from the wiring section 521. Similarly to the semiconductor devices A1 and A2, the semiconductor device A3 makes it possible to increase the inductance of the transmission path of the first drive signal from the control terminal 61 to each first semiconductor element 1 by increasing the length of the transmission path. Consequently, the semiconductor device A3 can prevent oscillation of the first drive signal without a resistor (e.g., gate resistance) connected to the third electrode 13. The semiconductor device A3 also achieves other advantages of the semiconductor devices A1 and A2 through the same configuration as those of the semiconductor devices A1 and A2.

The configuration of omitting the second semiconductor elements 2 as in the semiconductor device A3 described with reference to FIG. 18 may be applied to each of the semiconductor devices A1 and A2 as desired.

Figure 19:
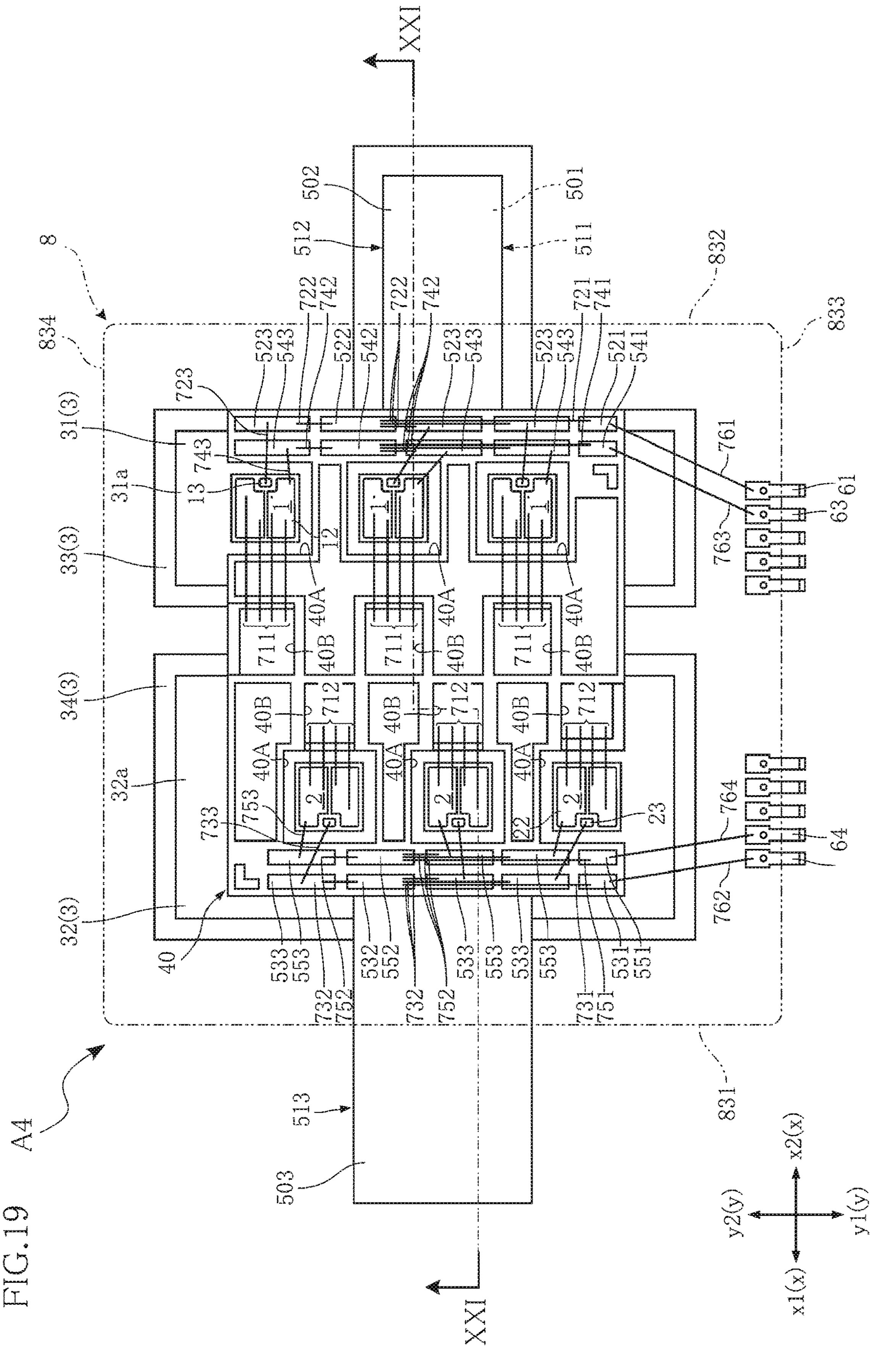
FIG. 19 is a plan view of a semiconductor device according to a fourth embodiment with a sealing member shown in phantom.
Figure 20:
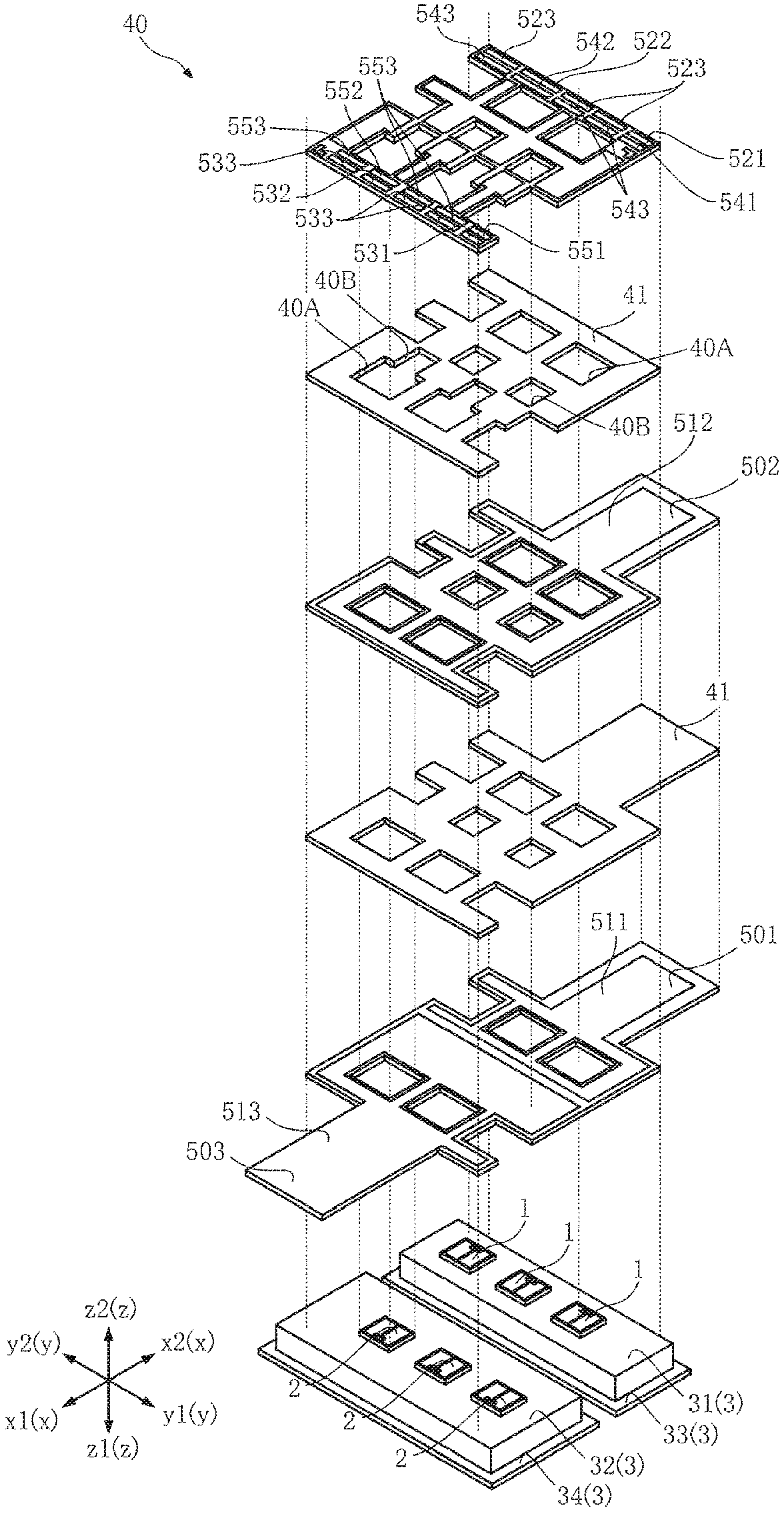
FIG. 20 is an exploded perspective view of parts of a semiconductor device according to a fourth embodiment.
Figure 21:
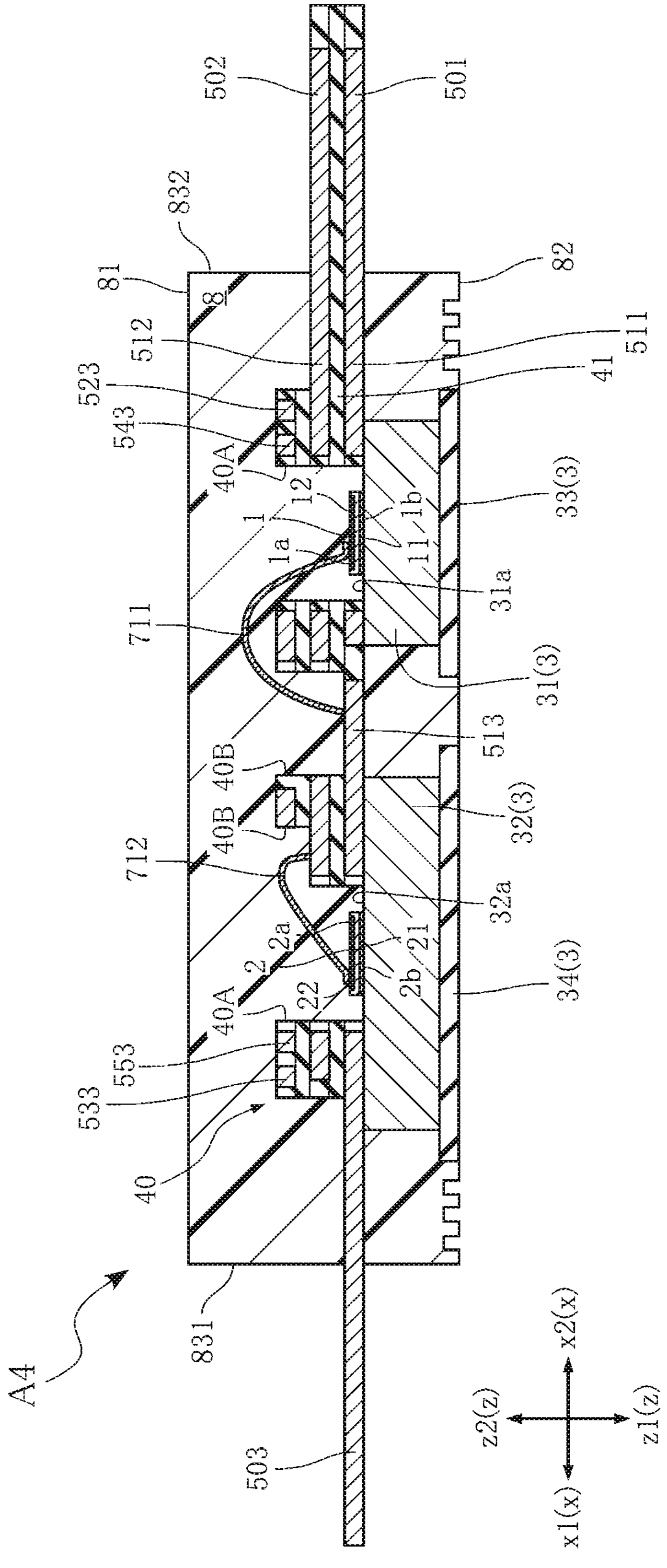
FIG. 21 is a sectional view taken along line XXI-XXI of FIG. 19.

FIGS. 19 to 21 show a semiconductor device A4 according to a fourth embodiment. FIG. 19 is a plan view of the semiconductor device A4, with the sealing member 8 shown in phantom (two-dot-dash lines). FIG. 20 is an exploded perspective view of a portion of the semiconductor device A4. FIG. 20 shows a plurality of first semiconductor elements 1, a plurality of second semiconductor elements 2, a supporting member 3 and a multilayer wiring substrate 40, which will be described later. FIG. 21 is a sectional view taken along line XXI-XXI of FIG. 19.

In the semiconductor device A4, the first semiconductor elements 1 are arranged side by side in the y direction, rather than in the x direction as in the semiconductor devices A1 to A3. Similarly, in the semiconductor device A4, the second semiconductor elements 2 are arranged side by side in the y direction, rather than in the x direction as in the semiconductor devices A1 to A3. In the semiconductor device A4, as shown in FIGS. 19 and 20, each of the first power-terminal portion 501, the second power-terminal portion 502 and the third power-terminal portion 503 is located on either side outward of the first semiconductor elements 1 in a perpendicular direction (the x direction) to the direction in which the first semiconductor elements 1 are arranged (the y direction). Similarly, each of the first power-terminal portion 501, the second power-terminal portion 502 and the third power-terminal portion 503 is located on either side outward of the second semiconductor elements 2 in a perpendicular direction (the x direction) to the direction in which the second semiconductor elements 2 are arranged (the y direction).

As shown in FIGS. 19 to 21, the semiconductor device A4 includes the multilayer wiring substrate 40. The multilayer wiring substrate 40 includes the insulating substrate 41 and the wiring sections 511 to 513, 521 to 523, 531 to 533, 541 to 543 and 551 to 553. The multilayer wiring substrate 40 forms conduction paths of the principal current and control signals of the semiconductor device A4. As shown in FIGS. 19 to 21, the wiring sections 511 to 513, 521 to 523, 531 to 533, 541 to 543 and 551 to 553 of the semiconductor device A4 have shapes and relative positions different from the wiring sections of the semiconductor device A1. However, their electrical connections are equivalent to those of the semiconductor device A1 and thus the electrical connections between the first semiconductor elements 1, the second semiconductor elements 2, the control terminals 61 and 62 and the detection terminals 63 and 64 are the as those in the semiconductor device A1.

As can be seen from FIGS. 20 and 21, the multilayer wiring substrate 40 includes a plurality of openings 40A and a plurality of recesses 40B. As shown in FIG. 21, the openings 40A allows the multilayer wiring substrate 40 to be disposed on the supporting member 3 without contacting the first semiconductor elements 1 and the second semiconductor elements 2 located inside the openings 40A. As shown in FIG. 21, in addition, portions of the wiring sections 512 and 513 are exposed through the recesses of the multilayer wiring substrate 40. The connecting members 711 are bonded to the portions of the wiring section 513 exposed through the recesses 40B, and the connecting members 712 are bonded to the portions of the wiring section 512 exposed through the recesses 40B.

As shown in FIG. 19, the semiconductor device A4 is provided with the wiring sections 522 and 523 added to the conduction paths between the wiring section 521, to which the control terminal 61 is electrically connected, and the third electrodes 13 of the first semiconductor elements 1. The wiring section 522 and 523 are separated from the wiring section 521. Similarly to the semiconductor devices A1 to A3, the semiconductor device A4 makes it possible to increase the inductance of the transmission path of the first drive signal from the control terminal 61 to each first semiconductor element 1 by increasing the length of the transmission path. Consequently, the semiconductor device A4 can prevent oscillation of the first drive signal without a resistor (e.g., gate resistance) connected to the third electrode 13. The semiconductor device A4 also achieves other advantages of the semiconductor devices A1 and A3 through the same configuration as those of the semiconductor devices A1 and A3.

Figure 22:
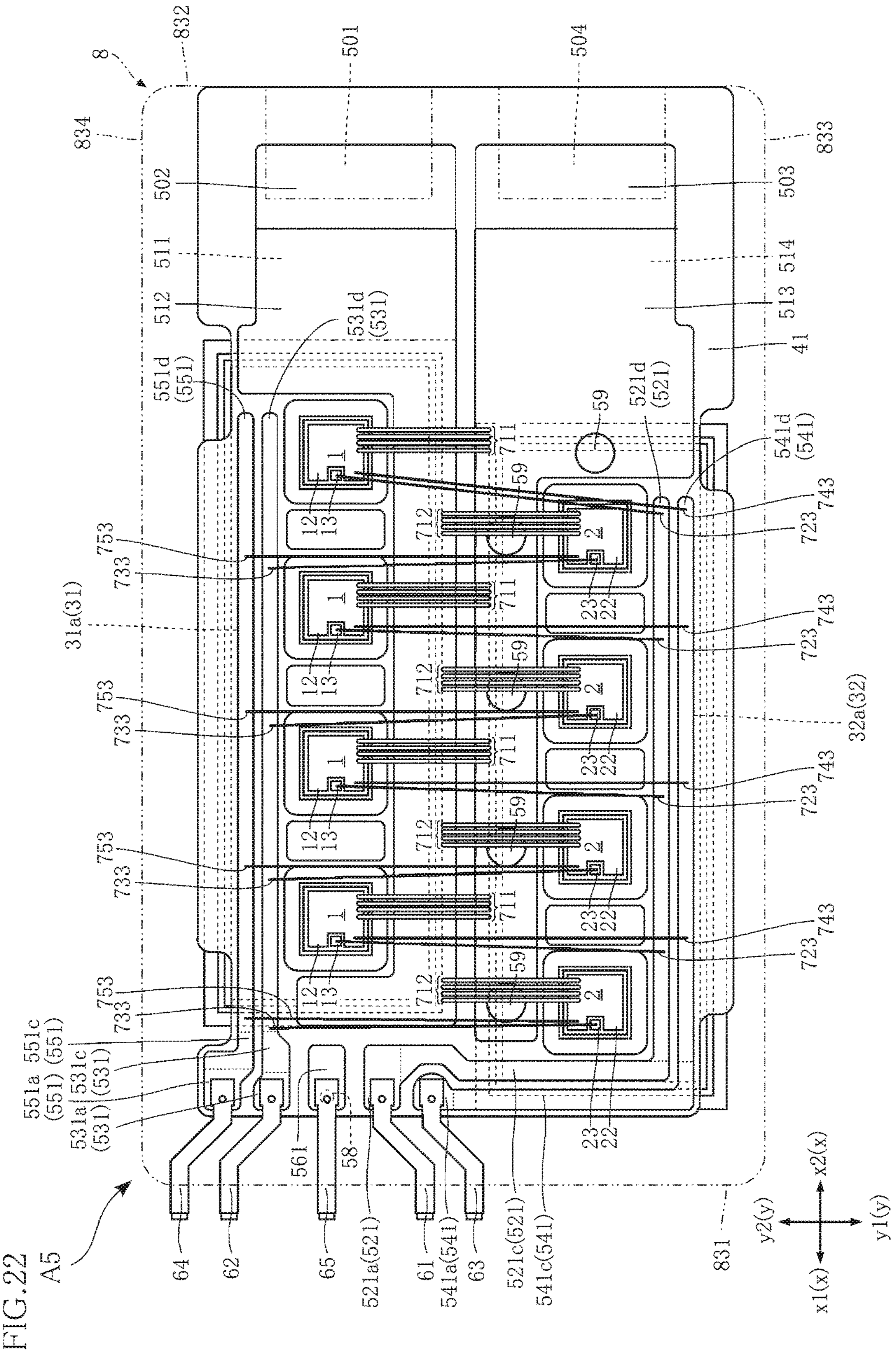
FIG. 22 is a plan view of a semiconductor device according to a fifth embodiment with a sealing member shown in phantom.

FIG. 22 shows a semiconductor device A5 according to a fifth embodiment. FIG. 22 is a plan view of the semiconductor device A5, with the sealing member 8 shown in phantom (two-dot-dash lines).

As shown in FIG. 22, the semiconductor device A5 differs from the semiconductor device A1 in that the wiring sections 522, 523, 532, 533, 542, 543, 552 and 553 are not included. Consequently, the semiconductor device A5 does not include the connecting members 721, 722, 731, 732, 741, 742, 751 and 752, which are included in the semiconductor device A1.

The wiring section 521 of the semiconductor device A5 includes a pad portion 521*a*, an interconnecting portion 521*c* and a strip portion 521*d*. The strip portion 521*d* extends in the x direction in plan view. The strip portion 521*d* is located on one side in the x direction (in the x2 direction in the example shown in FIG. 22) with respect to the pad portion 521*a*. The strip portion 521*d* is connected to the pad portion 521*a* via the interconnecting portion 521*c*.

The wiring section 531 of the semiconductor device A5 includes a pad portion 531*a*, an interconnecting portion 531*c* and a strip portion 531*d*. The strip portion 521*d* extends in the x direction in plan view. The strip portion 521*d* is located on one side in the x direction (in the x2 direction in the example shown in FIG. 22) with respect to the pad portion 521*a*. The strip portion 521*d* is connected to the pad portion 521*a* via the interconnecting portion 521*c*.

The wiring section 541 of the semiconductor device A5 includes a pad portion 541*a*, an interconnecting portion 541*c* and a strip portion 541*d*. The strip portion 541*d* extends in the x direction in plan view. The strip portion 541*d* is located on one side in the x direction (in the x2 direction in the example shown in FIG. 22) with respect to the pad portion 541*a*. The strip portion 541*d* is connected to the pad portion 541*a* via the interconnecting portion 541*c*.

The wiring section 551 of the semiconductor device A5 includes a pad portion 551*a*, an interconnecting portion 551*c* and a strip portion 551*d*. The strip portion 551*d* extends in the x direction in plan view. The strip portion 551*d* is located on one side in the x direction (in the x2 direction in the example shown in FIG. 22) with respect to the pad portion 551*a*. The strip portion 551*d* is connected to the pad portion 551*a* via the interconnecting portion 551*c*.

As shown in FIG. 22, the strip portions 521*d* and 541*d* are located on the side opposite the first semiconductor elements 1 in the y direction (i.e., located in the y1 direction) with respect to the second semiconductor elements 2. The strip portions 521*d* and 541*d* are longitudinally parallel to each other. In the example shown in FIG. 22, the strip portion 541*d* is located further than the strip portion 521*d* from the first semiconductor elements 1 and the second semiconductor elements 2 in the y direction (i.e., the y1 direction). In a different example, the relative positions of the strip portions 521*d* and 541*d* may be reversed. In the example shown in FIG. 22, the strip portions 521*d* and 541*d* overlap with the conductive plate 32 in plan view. In a different example, the strip portions 521*d* and 541*d* may be located further than the conductive plate 32 from the conductive plate 31 in the y direction (the y1 direction).

As shown in FIG. 22, the strip portions 531*d* and 551*d* are located on the side opposite the second semiconductor elements 2 in the y direction (i.e., in the y1 direction) with respect to the first semiconductor elements 1. The strip portions 531*d* and 551*d* are longitudinally parallel to each other. In the example shown in FIG. 22, the strip portion 551*d* is located further than the strip portion 531*d* from the first semiconductor elements 1 and the second semiconductor elements 2 in the y direction (i.e., the y1 direction). In a different example, the relative positions of the strip portions 531*d* and 541*d* may be reversed. In the example shown in FIG. 22, the strip portions 531*d* and 551*d* overlap with the conductive plate 31 in plan view. In a different example, the strip portions 531*d* and 551*d* may be located further than the conductive plate 31 from the conductive plate 32 in the y direction (located in the y2 direction).

Each connecting member 723 is bonded to a third electrode 13 and the strip portion 521*d*. Each connecting member 743 is bonded to a fifth electrode 22 and the strip portion 541*d*. That is, as shown in FIG. 22, each of the connecting members 723 and 743 crosses the gap between the conductive plates 31 and 32 and overlaps with the conductive plate 32 in plan view. In an example in which the strip portions 521*d* and 541*d* are located in the y1 direction from the conductive plate 32, the connecting members 723 and 743 cross the conductive plate 32 in plan view.

Each connecting member 733 is bonded to a sixth electrode 23 and the strip portion 531*d*. Each connecting member 753 is bonded to a fifth electrode 22 and the strip portion 551*d*. That is, as shown in FIG. 22, each of the connecting members 733 and 753 crosses the gap between the conductive plates 31 and 32 and overlaps with the conductive plate 31 in plan view. In an example in which the strip portions 531*d* and 551*d* are located in the y2 direction from the conductive plate 31, the connecting members 733 and 753 cross the conductive plate 31 in plan view.

In the semiconductor device A5, the wiring section 521 (the strip portion 521*d*) and the conductive plate 31 are located opposite to each other in the y direction across the conductive plate 32. With this configuration, each connecting member 723 connecting a third electrode 13 and the wiring section 521 (the strip portion 521*d*) overlaps with the conductive plate 32 in plan view. In addition, the wiring section 521 (the strip portion 521*d*) is located closer to the second semiconductor elements 2 than to the first semiconductor elements 1. That is, the connecting members 723 of the semiconductor device A5 are longer than those in a semiconductor device in which the wiring section 521 (the strip portion 521*d*) is located closer to the first semiconductor elements 1 than to the second semiconductor elements 2. The semiconductor device A5 makes it possible to increase the inductance of the transmission path of the first drive signal from each third electrode 13 to the control terminal 61 by increasing the length of the transmission path. This enables the semiconductor device A5 to prevent oscillation of the first drive signal without a resistor (e.g., gate resistance) connected to the third electrode 13.

In the semiconductor device A5, the first semiconductor elements 1 are arranged to electrically connect the first electrodes 11 with each other and the second electrodes 12 with each other. In other words, the first semiconductor elements 1 are connected in parallel. Similarly to the semiconductor device A1, this configuration involves the possibility that parasitic oscillation may be caused by a loop formed between the first electrode 11 and the third electrode 13 of each first semiconductor element 1. However, the semiconductor device A5 has longer conduction paths between the third electrodes 13 because the connecting members 723 are longer. The semiconductor device A5 can therefore prevent parasitic oscillation which may occur when the first semiconductor elements 1 are connected in parallel.

In the semiconductor device A5, the wiring section 531 (the strip portion 531*d*) and the conductive plate 32 are located opposite to each other in the y direction across the conductive plate 31. With this arrangement, each connecting member 733 connecting a sixth electrode 23 and the wiring section 531 (the strip portion 531*d*) overlaps with the conductive plate 31 in plan view. In addition, the wiring section 531 (the strip portion 531*d*) is located closer to the first semiconductor elements 1 than to the second semiconductor elements 2. The semiconductor device A5 therefore makes it possible to increase the inductance of the transmission path of the second drive signal in a similar manner as the inductance of the transmission path of the first drive signal. Consequently, the semiconductor device A5 can prevent oscillation of the second drive signal without a resistor (e.g., gate resistance) connected to the sixth electrode 23.

In the semiconductor device A5, the second semiconductor elements 2 are arranged to electrically connect the fourth electrodes 21 with each other and the fifth electrodes 22 with each other. In other words, the second semiconductor elements 2 are connected in parallel. Similarly to the semiconductor device A1, this configuration involves the possibility that parasitic oscillation may be caused by a loop formed between the fourth electrode 21 and the sixth electrode 23 of each second semiconductor element 2. However, the semiconductor device A5 has longer conduction paths between the sixth electrodes 23 because the connecting members 733 are longer. The semiconductor device A5 can therefore prevent parasitic oscillation that may occur when the second semiconductor elements 2 are connected in parallel.

The configurations of the wiring sections and the connecting members of the semiconductor device A5 described with reference to FIG. 22 may also be applied to each of the semiconductor devices A2 and A4 as desired.

The semiconductor device according to the present disclosure is not limited to the foregoing embodiments. Various design changes can be made to the specific configurations of each part of the semiconductor device according to the present disclosure. For example, the present disclosure includes the embodiments described in the following clauses.

Clause 1A. A semiconductor device comprising:

a plurality of first semiconductor elements each including a first electrode, a second electrode and a third electrode and each controlled to turn on and off current flow between the first electrode and the second electrode according to a first drive signal inputted to the third electrode;

a first control terminal that receives the first drive signal;

a first wiring section to which the first control terminal is electrically connected;

a second wiring section spaced apart from the first wiring section;

a plurality of third wiring sections spaced apart from the first wiring section and the second wiring section;

a first connecting member electrically connecting the first wiring section and the second wiring section;

a second connecting member electrically connecting the second wiring section and each of the plurality of third wiring sections; and a plurality of third connecting members each connecting one of the plurality of third wiring sections and the third electrode of one of the plurality of first semiconductor elements, wherein the first electrodes of the plurality of first semiconductor elements are electrically connected to each other, and the second electrodes of the plurality of first semiconductor elements are electrically connected to each other.

Clause 2A. The semiconductor device according to Clause 1A, further comprising an insulating substrate including a substrate obverse surface and a substrate reverse surface spaced apart from each other in a thickness direction, wherein the first wiring section, the second wiring section and the plurality of third wiring sections are formed on the substrate obverse surface.

Clause 3A. The semiconductor device according to Clause 2A, wherein the plurality of first semiconductor elements are arranged side by side in a first direction perpendicular to the thickness direction, and the second wiring section and the plurality of third wiring sections are located on one side in a second direction perpendicular to the thickness direction and the first direction with respect to the plurality of first semiconductor elements.

Clause 4A. The semiconductor device according to Clause 3A, wherein the second wiring section and the plurality of third wiring sections are arranged side by side in the first direction, and the plurality of third wiring sections include one located on one side in the first direction with respect to the second wiring section and one located on another side in the first direction with respect to the second wiring section.

Clause 5A. The semiconductor device according to Clause 4A, further comprising:

a first detection terminal that detects a conducting state of the second electrode of each of the plurality of first semiconductor elements;

a fourth wiring section to which the first detection terminal is electrically connected;

a fifth wiring section spaced apart from the fourth wiring section;

a plurality of sixth wiring sections spaced apart from the fourth wiring section and the fifth wiring section;

a fourth connecting member electrically connecting the fourth wiring section and the fifth wiring section;

a fifth connecting member electrically connecting the fifth wiring section and each of the plurality of sixth wiring sections; and a plurality of sixth connecting members each connecting one of the plurality of sixth wiring sections and the second electrode of one of the plurality of first semiconductor elements.

Clause 6A. The semiconductor device according to Clause 5A, wherein the fourth wiring section, the fifth wiring section and the plurality of sixth wiring sections are formed on the substrate obverse surface, and the fifth wiring section and the plurality of sixth wiring sections are located on the one side in the second direction with respect to the plurality of first semiconductor elements.

Clause 7A. The semiconductor device according to Clause 6A, wherein the fifth wiring section and the plurality of sixth wiring sections are arranged side by side in the first direction, and the plurality of sixth wiring sections include one located on one side in the first direction with respect to the fifth wiring section and one located on another side in the first direction with respect to the fifth wiring section.

Clause 8A. The semiconductor device according to Clause 7A, wherein the second wiring section and the fifth wiring section are arranged side by side in the second direction.

Clause 9A. The semiconductor device according to any one of Clauses 5A to 8A, further comprising:

a plurality of second semiconductor elements each including a fourth electrode, a fifth electrode and a sixth electrode and each controlled to turn on and off current flow between the fourth electrode and the fifth electrode according to a second drive signal inputted to the sixth electrode;

a second control terminal that receives the second drive signal;

a seventh wiring section to which the second control terminal is electrically connected;

an eighth wiring section spaced apart from the seventh wiring section;

a plurality of ninth wiring sections spaced apart from the seventh wiring section and the eighth wiring section;

a seventh connecting member electrically connecting the seventh wiring section and the eighth wiring section;

an eighth connecting member electrically connecting the eighth wiring section and each of the plurality of ninth wiring sections; and a plurality of ninth connecting members each connecting one of the plurality of ninth wiring sections and the sixth electrode of one of the plurality of second semiconductor elements, wherein the fourth electrodes of the plurality of second semiconductor elements are electrically connected to each other, and the fifth electrodes of the plurality of second semiconductor elements are electrically connected to each other.

Clause 10A. The semiconductor device according to Clause 9A, wherein the seventh wiring section, the eighth wiring section and the plurality of ninth wiring sections are formed on the substrate obverse surface.

Clause 11A. The semiconductor device according to Clause 10A, wherein the plurality of second semiconductor elements are arranged side by side in the first direction, and the eighth wiring section and the plurality of ninth wiring sections are located on one side in the second direction with respect to the plurality of second semiconductor elements.

Clause 12A. The semiconductor device according to Clause 11A, wherein the eighth wiring section and the plurality of ninth wiring sections are arranged side by side in the first direction, and the plurality of ninth wiring sections include one located on one side in the first direction with respect to the eighth wiring section and one located on another side in the first direction with respect to the eighth wiring section.

Clause 13A. The semiconductor device according to Clause 12A, further comprising:

a second detection terminal that detects a conducting state of the fifth electrode of each of the plurality of second semiconductor elements;

a tenth wiring section to which the second detection terminal is electrically connected;

an eleventh wiring section spaced apart from the tenth wiring section;

a plurality of twelfth wiring sections spaced apart from the tenth wiring section and the eleventh wiring section;

a tenth connecting member electrically connecting the tenth wiring section and the eleventh wiring section;

an eleventh connecting member electrically connecting the eleventh wiring section and each of the plurality of twelfth wiring sections; and a plurality of twelfth connecting members each connecting one of the plurality of twelfth wiring sections and the fifth electrode of one of the plurality of second semiconductor elements.

Clause 14A. The semiconductor device according to Clause 13A, wherein the tenth wiring section, the eleventh wiring section and the plurality of twelfth wiring sections are formed on the substrate obverse surface, and the eleventh wiring section and the plurality of twelfth wiring sections are located on the one side in the second direction with respect to the plurality of second semiconductor elements.

Clause 15A. The semiconductor device according to Clause 14A, wherein the eleventh wiring section and the plurality of twelfth wiring sections are arranged side by side in the first direction, and the plurality of twelfth wiring sections include one located on one side in the first direction with respect to the tenth wiring section and one located on another side in the first direction with respect to the tenth wiring section.

Clause 16A. The semiconductor device according to Clause wherein the eighth wiring section and the eleventh wiring section are arranged side by side in the second direction.

Clause 17A. The semiconductor device according to any one of Clauses 9A to 16A, wherein each of the plurality of first semiconductor elements includes a first-element obverse surface facing in a same direction as the substrate obverse surface in the thickness direction and a first-element reverse surface facing in a same direction as the substrate reverse surface in the thickness direction, the first-element reverse surface is provided with the first electrode, and the first-element obverse surface is provided with the second electrode and the third electrode, and each of the plurality of second semiconductor elements includes a second-element obverse surface facing in a same direction as the substrate obverse surface in the thickness direction and a second-element reverse surface facing in a same direction as the substrate reverse surface in the thickness direction, the second-element reverse surface is provided with the fourth electrode, and the second-element obverse surface is provided with the fifth electrode and the sixth electrode.

Clause 18A. The semiconductor device according to Clause 17A, further comprising:

a first mounting portion on which the plurality of first semiconductor elements are mounted; and a second mounting portion on which the plurality of second semiconductor elements are mounted, wherein the first mounting portion and the second mounting portion are each made of an electrically conductive material and are spaced apart from each other, the first electrodes of the plurality of first semiconductor elements are electrically connected to each other via the first mounting portion, and the fourth electrodes of the plurality of second semiconductor elements are electrically connected to each other via the second mounting portion.

Clause 19A. The semiconductor device according to Clause 18A, wherein the first mounting portion and the second mounting portion face toward the substrate reverse surface, the insulating substrate includes a plurality of first openings and a plurality of second openings, each of the plurality of first and second openings extending in the thickness direction from the substrate obverse surface through to the substrate reverse surface, each of the plurality of first openings surrounds one of the plurality of first semiconductor elements as viewed in the thickness direction, and each of the plurality of second openings surrounds one of the plurality of second semiconductor elements as viewed in the thickness direction.

Clause 20A. The semiconductor device according to any one of Clauses 9A to 19A, further comprising:

a first power-terminal portion electrically connected to the first electrodes of the plurality of first semiconductor elements;

a second power-terminal portion electrically connected to the fifth electrodes of the plurality of second semiconductor elements; and a third power-terminal portion electrically connected to the second electrodes of the plurality of first semiconductor elements and the fourth electrodes of the plurality of second semiconductor elements, wherein the first power-terminal portion and the second power-terminal portion receive direct-current voltage, the direct-current voltage is converted to alternating-current voltage by controlling on and off of each of the plurality of first semiconductor elements and the plurality of second semiconductor elements, and the alternating-current voltage is outputted from the third power-terminal portion.

Clause 1B. A semiconductor device comprising:

a plurality of first semiconductor elements each of which is controlled on and off according to a first drive signal;

a plurality of second semiconductor elements each of which is controlled on and off according to a second drive signal;

a first mounting portion including a first mounting surface facing toward one side in a thickness direction, the first mounting surface being provided with the plurality of first semiconductor elements mounted thereon;

a second mounting portion including a second mounting surface facing toward a same side in the thickness direction as the first mounting surface, the second mounting surface being provided with the plurality of second semiconductor elements mounted thereon;

a first control terminal that receives the first drive signal;

a second control terminal that receives the second drive signal;

a first wiring section to which the first control terminal is connected and the first drive signal is transmitted;

a second wiring section to which the second control terminal is connected and the second drive signal is transmitted;

a plurality of first connecting members each connecting one of the plurality of first semiconductor elements and the first wiring section; and a plurality of second connecting members each connecting one of the plurality of second semiconductor elements and the second wiring section, wherein the first wiring section and the first mounting portion are located opposite to each other in a first direction perpendicular to the thickness direction across the second mounting portion, and the plurality of first connecting members overlap with the second mounting portion as viewed in the thickness direction.

Clause 2B. The semiconductor device according to Clause 1B, wherein the second wiring section and the second mounting portion are located opposite to each other in the first direction with across the first mounting portion, and the plurality of second connecting members overlap with the first mounting portion as viewed in the thickness direction.

REFERENCE NUMERALS

| | |
|---|---|
| A1 to A4: semiconductor device | 1: first semiconductor element |
| 1a: element obverse surface | 1b: element reverse surface |
| 11: first electrode | 12: second electrode |
| 13: third electrode | 19: conductive bonding material |
| 2: second semiconductor element | 2a: element obverse surface |
| 2b: element reverse surface | 21: fourth electrode |
| 22: fifth electrode | 23: sixth electrode |
| 29: conductive bonding material | 3: supporting member |
| 31, 32: conductive plate | 31a, 32a: mounting surface |
| 319, 329: bonding material | 33, 34: insulating plate |
| 41: insulating substrate | 411: obverse surface |
| 412: reverse surface | 413: through-hole |
| 414: through-hole | 415: opening |
| 416: opening | 501: first power-terminal portion |
| 502: second power-terminal portion | |
| 503: third power-terminal portion | |
| 504: fourth power-terminal portion | |
| 511 to 514: wiring section | |
| 511a, 514a: opening | |
| 511b, 513a, 514b: through-hole | |
| 519a, 519b, 519c: coupling member | |
| 521, 522, 523: wiring section | |
| 521a, 521b: pad portion | |
| 521c: interconnecting portion | 521d: strip portion |
| 531, 532, 533: wiring section | |
| 531a, 531b: pad portion | |
| 531c: interconnecting portion | 531d: strip portion |
| 541, 542, 543: wiring section | |
| 541a, 541b: pad portion | |
| 541c: interconnecting portion | 541d: strip portion |
| 551, 552, 553: wiring section | |
| 551a, 551b: pad portion | |
| 551c: interconnecting portion | 551d: strip portion |
| 561: wiring section | 561a: through-hole |
| 571 to 573: wiring section | 58: metal member |
| 59: metal member | 601: first power terminal |
| 602: second power terminal | 603: third power terminal |
| 604: fourth power-terminal portion | 61, 62: control terminal |
| 63, 64, 65: detection terminal | 7: connecting member |
| 711, 712: connecting member | 721 to 723: connecting member |
| 731 to 733: connecting member | 741 to 743: connecting member |
| 751 to 753: connecting member | 761 to 764: connecting member |
| 771 to 774: connecting member | 781: connecting member |
| 8: sealing member | 81: resin obverse surface |
| 82: resin reverse surface | 831 to 834: resin side surface |
| 9: case | 91: heat dissipation plate |
| 92: top plate | 93: frame |
| 931, 932: side wall | 941 to 944: terminal support |

The invention claimed is:

1. A semiconductor device comprising:

a plurality of first semiconductor elements each including a first electrode, a second electrode and a third electrode and each controlled to turn on and off current flow between the first electrode and the second electrode according to a first drive signal inputted to the third electrode;

a first control terminal that receives the first drive signal;

a first wiring section to which the first control terminal is electrically connected;

a second wiring section spaced apart from the first wiring section;

a plurality of third wiring sections spaced apart from the first wiring section and the second wiring section;

a first connecting member electrically connecting the first wiring section and the second wiring section;

a second connecting member electrically connecting the second wiring section and each of the plurality of third wiring sections; and a plurality of third connecting members each connecting one of the plurality of third wiring sections and the third electrode of one of the plurality of first semiconductor elements, wherein the first electrodes of the plurality of first semiconductor elements are electrically connected to each other, and the second electrodes of the plurality of first semiconductor elements are electrically connected to each other.

2. The semiconductor device according to claim 1, further comprising an insulating substrate including a substrate obverse surface and a substrate reverse surface spaced apart from each other in a thickness direction, wherein the first wiring section, the second wiring section and the plurality of third wiring sections are formed on the substrate obverse surface.

3. The semiconductor device according to claim 2, wherein the plurality of first semiconductor elements are arranged side by side in a first direction perpendicular to the thickness direction, and the second wiring section and the plurality of third wiring sections are located on one side in a second direction perpendicular to the thickness direction and the first direction with respect to the plurality of first semiconductor elements.

4. The semiconductor device according to claim 3, wherein the second wiring section and the plurality of third wiring sections are arranged side by side in the first direction, and the plurality of third wiring sections include one located on one side in the first direction with respect to the second wiring section and one located on another side in the first direction with respect to the second wiring section.

5. The semiconductor device according to claim 4, further comprising:

a first detection terminal that detects a conducting state of the second electrode of each of the plurality of first semiconductor elements;

a fourth wiring section to which the first detection terminal is electrically connected;

a fifth wiring section spaced apart from the fourth wiring section;

a plurality of sixth wiring sections spaced apart from the fourth wiring section and the fifth wiring section;

a fourth connecting member electrically connecting the fourth wiring section and the fifth wiring section;

a fifth connecting member electrically connecting the fifth wiring section and each of the plurality of sixth wiring sections; and a plurality of sixth connecting members each connecting one of the plurality of sixth wiring sections and the second electrode of one of the plurality of first semiconductor elements.

6. The semiconductor device according to claim 5, wherein the fourth wiring section, the fifth wiring section and the plurality of sixth wiring sections are formed on the substrate obverse surface, and the fifth wiring section and the plurality of sixth wiring sections are located on the one side in the second direction with respect to the plurality of first semiconductor elements.

7. The semiconductor device according to claim 6, wherein the fifth wiring section and the plurality of sixth wiring sections are arranged side by side in the first direction, and the plurality of sixth wiring sections include one located on one side in the first direction with respect to the fifth wiring section and one located on another side in the first direction with respect to the fifth wiring section.

8. The semiconductor device according to claim 7, wherein the second wiring section and the fifth wiring section are arranged side by side in the second direction.

9. The semiconductor device according to claim 5, further comprising:

a plurality of second semiconductor elements each including a fourth electrode, a fifth electrode and a sixth electrode and each controlled to turn on and off current flow between the fourth electrode and the fifth electrode according to a second drive signal inputted to the sixth electrode;

a second control terminal that receives the second drive signal;

a seventh wiring section to which the second control terminal is electrically connected;

an eighth wiring section spaced apart from the seventh wiring section;

a plurality of ninth wiring sections spaced apart from the seventh wiring section and the eighth wiring section;

a seventh connecting member electrically connecting the seventh wiring section and the eighth wiring section;

an eighth connecting member electrically connecting the eighth wiring section and each of the plurality of ninth wiring sections; and a plurality of ninth connecting members each connecting one of the plurality of ninth wiring sections and the sixth electrode of one of the plurality of second semiconductor elements, wherein the fourth electrodes of the plurality of second semiconductor elements are electrically connected to each other, and the fifth electrodes of the plurality of second semiconductor elements are electrically connected to each other.

10. The semiconductor device according to claim 9, wherein the seventh wiring section, the eighth wiring section and the plurality of ninth wiring sections are formed on the substrate obverse surface.

11. The semiconductor device according to claim 10, wherein the plurality of second semiconductor elements are arranged side by side in the first direction, and the eighth wiring section and the plurality of ninth wiring sections are located on one side in the second direction with respect to the plurality of second semiconductor elements.

12. The semiconductor device according to claim 11, wherein the eighth wiring section and the plurality of ninth wiring sections are arranged side by side in the first direction, and the plurality of ninth wiring sections include one located on one side in the first direction with respect to the eighth wiring section and one located on another side in the first direction with respect to the eighth wiring section.

13. The semiconductor device according to claim 12, further comprising:

a second detection terminal that detects a conducting state of the fifth electrode of each of the plurality of second semiconductor elements;

a tenth wiring section to which the second detection terminal is electrically connected;

an eleventh wiring section spaced apart from the tenth wiring section;

a plurality of twelfth wiring sections spaced apart from the tenth wiring section and the eleventh wiring section;

a tenth connecting member electrically connecting the tenth wiring section and the eleventh wiring section;

an eleventh connecting member electrically connecting the eleventh wiring section and each of the plurality of twelfth wiring sections; and a plurality of twelfth connecting members each connecting one of the plurality of twelfth wiring sections and the fifth electrode of one of the plurality of second semiconductor elements.

14. The semiconductor device according to claim 13, wherein the tenth wiring section, the eleventh wiring section and the plurality of twelfth wiring sections are formed on the substrate obverse surface, and the eleventh wiring section and the plurality of twelfth wiring sections are located on the one side in the second direction with respect to the plurality of second semiconductor elements.

15. The semiconductor device according to claim 14, wherein the eleventh wiring section and the plurality of twelfth wiring sections are arranged side by side in the first direction, and the plurality of twelfth wiring sections include one located on one side in the first direction with respect to the tenth wiring section and one located on another side in the first direction with respect to the tenth wiring section.

16. The semiconductor device according to claim 15, wherein the eighth wiring section and the eleventh wiring section are arranged side by side in the second direction.

17. The semiconductor device according to claim 9, wherein each of the plurality of first semiconductor elements includes a first-element obverse surface facing in a same direction as the substrate obverse surface in the thickness direction and a first-element reverse surface facing in a same direction as the substrate reverse surface in the thickness direction, the first-element reverse surface is provided with the first electrode, and the first-element obverse surface is provided with the second electrode and the third electrode, and each of the plurality of second semiconductor elements includes a second-element obverse surface facing in a same direction as the substrate obverse surface in the thickness direction and a second-element reverse surface facing in a same direction as the substrate reverse surface in the thickness direction, the second-element reverse surface is provided with the fourth electrode, and the second-element obverse surface is provided with the fifth electrode and the sixth electrode.

18. The semiconductor device according to claim 17, further comprising:

a first mounting portion on which the plurality of first semiconductor elements are mounted; and a second mounting portion on which the plurality of second semiconductor elements are mounted, wherein the first mounting portion and the second mounting portion are each made of an electrically conductive material and are spaced apart from each other, the first electrodes of the plurality of first semiconductor elements are electrically connected to each other via the first mounting portion, and the fourth electrodes of the plurality of second semiconductor elements are electrically connected to each other via the second mounting portion.

19. The semiconductor device according to claim 18, wherein the first mounting portion and the second mounting portion face toward the substrate reverse surface, the insulating substrate includes a plurality of first openings and a plurality of second openings, each of the plurality of first and second openings extending in the thickness direction from the substrate obverse surface through to the substrate reverse surface, each of the plurality of first openings surrounds one of the plurality of first semiconductor elements as viewed in the thickness direction, and each of the plurality of second openings surrounds one of the plurality of second semiconductor elements as viewed in the thickness direction.

20. The semiconductor device according to claim 9, further comprising:

a first power-terminal portion electrically connected to the first electrodes of the plurality of first semiconductor elements;

a second power-terminal portion electrically connected to the fifth electrodes of the plurality of second semiconductor elements; and a third power-terminal portion electrically connected to the second electrodes of the plurality of first semiconductor elements and the fourth electrodes of the plurality of second semiconductor elements, wherein the first power-terminal portion and the second power-terminal portion receive direct-current voltage, the direct-current voltage is converted to alternating-current voltage by controlling on and off of each of the plurality of first semiconductor elements and the plurality of second semiconductor elements, and the alternating-current voltage is outputted from the third power-terminal portion.

* * * * *